(12) United States Patent  (10) Patent No.: US 8,698,681 B2
Leung et al.  (45) Date of Patent: Apr. 15, 2014

(54) SOLAR ENERGY COLLECTION ANTENNAS

(75) Inventors: Kwok Wa Leung, Hong Kong (CN);
Eng Hock Lim, Selangor Darul Ehsan (MY)

(73) Assignee: City University of Hong Kong, Kowloon (HK)

( * ) Notice: Subject to any disclaimer, the term of this patent is extended or adjusted under 35 U.S.C. 154(b) by 992 days.

(21) Appl. No.: 12/764,521

(22) Filed: Apr. 21, 2010

(65) Prior Publication Data

US 2011/0260936 A1  Oct. 27, 2011

(51) Int. Cl.
*H01Q 1/00* (2006.01)
*H01Q 21/08* (2006.01)
*H01Q 19/10* (2006.01)

(52) U.S. Cl.
USPC ............................ 343/720; 343/824; 343/832

(58) Field of Classification Search
USPC .......................................... 343/720, 824, 832
See application file for complete search history.

(56) References Cited

U.S. PATENT DOCUMENTS

| | | | |
|---|---|---|---|
| 3,969,731 A | 7/1976 | Jenkins et al. | |
| 4,388,481 A | 6/1983 | Uroshevich | |
| 4,463,055 A | 7/1984 | Hodges | |
| 4,491,388 A | 1/1985 | Wood | |
| 4,566,432 A | 1/1986 | Sobczak et al. | |
| 4,716,258 A | 12/1987 | Murtha | |
| 4,780,726 A | 10/1988 | Archer et al. | |
| 4,788,555 A | 11/1988 | Schultz et al. | |
| 4,860,023 A | 8/1989 | Halm | |
| 4,862,190 A | 8/1989 | Palmer et al. | |
| 4,864,317 A * | 9/1989 | Sorko-Ram | 343/720 |
| 5,248,519 A | 9/1993 | Stoakley et al. | |
| 5,325,103 A | 6/1994 | Schuss | |
| 5,529,054 A | 6/1996 | Shoen | |
| 5,608,414 A | 3/1997 | Amore | |
| 6,015,950 A | 1/2000 | Converse | |
| 6,036,323 A | 3/2000 | Meijer | |
| 6,075,200 A | 6/2000 | O'Neill | |
| 6,111,190 A | 8/2000 | O'Neill | |
| 6,191,757 B1 | 2/2001 | Bassily et al. | |
| 6,260,808 B1 | 7/2001 | Bodeau et al. | |
| 6,359,555 B1 | 3/2002 | Williams | |
| 6,394,395 B1 | 5/2002 | Poturalski et al. | |
| 6,441,801 B1 | 8/2002 | Knight et al. | |

(Continued)

FOREIGN PATENT DOCUMENTS

WO  9850978 A1  11/1998

OTHER PUBLICATIONS

"Arrays: Linear Planar and Circular," Antenna Theory Analysis and Design, 3$^{rd}$ Edition, Constantine Balanis, 2005, pp. 283 to 371.*

(Continued)

*Primary Examiner* — Dameon Levi
*Assistant Examiner* — Graham Smith
(74) *Attorney, Agent, or Firm* — Amin, Turocy & Watson, LLP

(57) ABSTRACT

The subject disclosure relates to solar energy collection and use in communications systems and to enhancements thereof. In an aspect, dual function antennas are disclosed that can simultaneously function as an antenna and as a solar energy collection system. In further aspects, disclosed embodiments can focus incident solar radiation to increase output voltage of conventional solar cells. Measured and simulated results demonstrate various aspects of the subject disclosure.

15 Claims, 29 Drawing Sheets

(56) References Cited

U.S. PATENT DOCUMENTS

| | | | |
|---|---|---|---|
| 6,495,843 | B1 | 12/2002 | Tavkelidze |
| 6,590,150 | B1 * | 7/2003 | Kiefer ............................ 136/258 |
| 6,593,887 | B2 * | 7/2003 | Luk et al. ............... 343/700 MS |
| 6,897,832 | B2 | 5/2005 | Essig, Jr. et al. |
| 6,994,441 | B2 | 2/2006 | Willits |
| 7,014,329 | B2 | 3/2006 | Claypool |
| 7,102,579 | B2 | 9/2006 | Haaft et al. |
| 7,119,746 | B2 | 10/2006 | Luk et al. |
| 7,173,179 | B2 | 2/2007 | Nicoletti et al. |
| 7,612,735 | B2 | 11/2009 | Essig, Jr. et al. |
| 7,878,192 | B2 * | 2/2011 | Larsen ........................... 126/696 |
| 2002/0102196 | A1 | 8/2002 | Smalley et al. |
| 2008/0000232 | A1 | 1/2008 | Rogers et al. |
| 2008/0053513 | A1 | 3/2008 | Palmer |
| 2008/0055177 | A1 | 3/2008 | Dixon |
| 2008/0163864 | A1 | 7/2008 | Larson |
| 2008/0163984 | A1 | 7/2008 | Lambey |
| 2008/0178867 | A1 | 7/2008 | Domenico |
| 2008/0206534 | A1 | 8/2008 | Brooks |
| 2008/0236569 | A1 | 10/2008 | Tuccio |
| 2008/0251112 | A1 | 10/2008 | Jenkins |
| 2008/0276982 | A1 | 11/2008 | Jordan et al. |
| 2009/0000613 | A1 | 1/2009 | Edwards et al. |
| 2009/0165782 | A1 | 7/2009 | Hodges et al. |
| 2009/0194145 | A1 | 8/2009 | Kribus et al. |
| 2009/0223510 | A1 | 9/2009 | Larsen |
| 2010/0095330 | A1 | 4/2010 | Pal |

OTHER PUBLICATIONS

Mak et al., "Experimental study of a microstrip patch antenna with an L-Shaped probe," IEEE Trans. Antennas Propagat., vol. 48, pp. 777-783, May 2000.

Guo et al., "Wide-band L-probe fed circular patch antenna for conical-pattern radiation," IEEE Trans. Antennas Propagat., vol. 52, pp. 1115-1116, Apr. 2004.

Wong et al., "Design of dual-polarized L-probe patch antenna arrays with high isolation," IEEE Trans. Antennas Propagat., vol. 52, pp. 45-52, Jan. 2004.

Maurin et al., "A compact 1.7-2.1 GHz three-way power combiner using microstrip technology with better than 93.8% combining efficiency," IEEE Microwave and Guided Wave Lett., vol. 6, No. 2, pp. 106-109, Feb. 1996.

Diver et al., "Practical field alignment of parabolic trough solar concentrators," Journal of Solar Energy Eng., vol. 129, pp. 153-159, May 2007.

Kussul et al., "Flat facet parabolic solar concentrator with support cell for one and more mirrors," WSEAS Trans. Power Systems, vol. 3, No. 8, pp. 577-586, Aug. 2008.

Sargent & Lundy LLC, National Renewable Energy Laboratory/SR-550-34440 "Report: Assessment of parabolic trough and power tower solar technology cost and performance forecasts," Oct. 2003.

Stine and Halligan, Eds, "Solar energy fundamentals and design with computer applications," New York: John Wiley, pp. 135-262, 1985.

Tanaka et al., "Microstrip antenna with solar cells for microsatellites," Electron. Lett., vol. 31, No. 1, pp. 5-6, Jan. 1995.

Vaccaro et al., "Two advanced solar antenna "SOLANT" designs for satellite and terrestrial communications," IEEE Trans. Antennas Propagat., vol. 51, pp. 2028-2034, Aug. 2003.

Turpin et al., "Meshed patch antennas integrated on solar cells," IEEE Antennas and Wireless Propagat. Lett., vol. 8, pp. 693-696, 2009.

Ons et al., "Emitter-wrap-through photovoltaic dipole antenna with solar concentrator," Electron. Lett., vol. 45, No. 5, pp. 241-242, Feb. 2009.

Lim et al., "Transparent dielectric resonator antennas for optical applications," IEEE Trans. Antennas and Propagat. (vol. 58, Issue 4), pp. 1054-1059, 2010.

Nakano et al., "C-figured loop antennas," Electron. Lett., vol. 31, No. 9, pp. 693-694, Apr. 1995.

Luk et al., "Broadband microstrip patch antenna," Electron. Lett., vol. 34, No. 15, pp. 1442-1443, Jul. 1998.

Non Final Office Action dated Apr. 5, 2013 for U.S. Appl. No. 12/764,534, 20 pages.

C. A. Balanis, "Antenna Theory Analysis and Design," 2nd ed. New York: Wiley, 1997. Section 15.3, pp. 786-794.

Summary of Examiner Interview dated Mar. 6-7, 2013 for U.S. Appl. No. 12/764,534, filed Mar. 11, 2013, 6 pages.

\* cited by examiner

SOLAR ENERGY COLLECTION ANTENNAS

TECHNICAL FIELD

The subject disclosure relates to solar energy and communications, and more particularly to enhanced devices, systems, and methodologies for solar energy collection and use in communications systems.

BACKGROUND

Conventionally in modern wireless systems, antennas are used to receive and transmit microwave signals. Typically, such systems are powered by local electrical grid connections and are connected to backup power systems such as battery banks, emergency diesel generators, and so on. However, such systems merely rely on conventional power systems that, at the source, derive energy from non-renewable fossil fuels.

As fuel prices rise and geopolitical uncertainties have highlighted the risks associated with the primary reliance on non-renewable fossil fuels, renewable energy sources have been sought for an increasing array of applications. For example, wind farms, solar thermal concentrators, photovoltaic enhancements, and other renewable energy projects have received increasing attention from governments, manufacturers, and consumers alike. Whether renewable energy is viewed as a more cost effective way to power modern devices in the face of energy price risk, or whether it is viewed as a way of more socially responsible or "green" living, renewable energy sources are targeted to an increasing array of facets of modern life.

For instance, with the promotion of a green environment or green living, it is of increasing interest to utilize renewable energy in modern wireless systems. In conventional solar power generation plants, solar cells are typically used with reflectors to improve the light-power utilization. For instance, a parabolic trough can be used as a solar reflectors to redirect sunlight to solar cells to increase the light intensity at the solar cells, and thus, a smaller number of photovoltaic cells are used for a given power demand.

Recently, use of planar mirrors as solar reflectors has been investigated. For instance, the National Renewable Energy Laboratory in the United States has estimated that the reflector-type power plant would be able to produce electricity at a relatively low cost of 5.49 cents per kiloWatt-hour by year 2020, which could make solar power one of the cheapest renewable energy sources in the future. Thus, while solar power is a primary source for renewable energy, typically, solar power generation systems are separated from end use locations. As such, use of solar power still suffers from inefficiencies associated with transport losses.

This transport loss problem is exacerbated by the disparity in preferred locations between renewable power generation systems and wireless communication components such as antennas and transmission equipment. For example, wireless antennas can be located close to densely populated urban centers, along popular travel corridors, or other areas that are economically feasible. These areas may not be remote depending on the geography and topography. However, typically, renewable energy generation systems are placed in more remote areas due to space or other requirements. For instance, solar concentrators require a large area and are typically remotely located to capitalize on lower real property costs. As a further example, wind farms are primarily located based on available wind energy, and can be remote from densely populated urban centers.

Recently, some solutions to the transmission loss problem have focused on integrating an antenna with solar cells, for example, by etching slot antennas on a solar cell panel. However, such solutions increase transmission effectiveness at the expense of reducing the effective illumination area for solar energy production. In other proposals, solutions have focused on integrating a meshed patch antenna on solar cells or on placing a folded photovoltaic cell, which also functions as an antenna, in the focal line of a parabolic trough. In yet other solutions, a dual function transparent dielectric resonator antenna that additionally serves as a focusing lens for a solar cell panel has been proposed.

In addition, for developing nations, expansion of wireless markets can face unique challenges. For example, in developing nations, traditional power infrastructures may or may not be available. For instance, due to topographical or other challenges, a conventional power grid can be rendered economically infeasible, which in turn, can prevent establishment of wireless communication systems.

In yet other situations, a limited potential user base for either power generation or wireless communication can otherwise prevent establishment of wireless communication systems without expensive power systems being developed to power such communication systems. For example, in a remote wireless sensor network such as a tsunami warning system, for example, the remote monitoring of seismological and tidal stations across a vast expanse of an ocean basin can require remote installations where it would not be economically feasible to establish conventional power generation systems or even large scale renewable energy generation systems.

It is thus desired to provide enhanced systems, devices, and methodologies for solar energy collection and use in communications systems that improve upon these and other deficiencies. The above-described deficiencies in solar energy collection and use in communications systems are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In various non-limiting embodiments of the disclosed subject matter, systems, devices, and methodologies that facilitate solar energy collection and use in communications systems are described. For instance, in exemplary implementations, disclosed embodiments provide dual function antennas that can simultaneously function as an antenna and as a solar energy collection system. For example, exemplary embodiments can provide self-sustaining power to wireless systems employing such implementations. As a further advantage, the dual function characteristic (e.g., radiating antennas for wireless communication and solar energy focusing or collecting) can result in cost reductions in the design, fabrication, and/or operation of systems employing such implementations.

Accordingly, various embodiments for solar energy collection and use in communications systems are described herein. To that end, solar energy collection antennas are described comprising one or more of a reflective ground plane and a reflective antenna element that can direct incident solar radiation to one or more solar cells. In a non-limiting aspect, non-planar reflective ground planes, such as a V-shaped and a U-shaped reflective ground plane, are described. In further non-limiting embodiments, solar energy collection antennas are described comprising a selective transmission layer adjacent to one or more solar cells that can transmit incident solar radiation to the one or more solar cells while selectively reflecting communication signals to a communication antenna. In a further non-limiting aspect, conformal solar cells located adjacent to a reflector structure of an antenna are described.

In other exemplary implementations, solar energy collection systems for powering an associated communications antenna are described, in which the communications antenna can be configured to reflect incident solar radiation to one or more associated solar cells. In other non-limiting implementations, solar energy collection systems adapted to power an associated communications antenna can comprise a selective transmission layer adjacent to one or more solar cells that can transmit incident solar radiation to the one or more solar cells and can selectively reflect communication signals to the communications antenna.

In further embodiments, methodologies for collecting and employing solar energy proximate to a communications antenna according to various non-limiting embodiments are described.

These and other embodiments are described in more detail below.

BRIEF DESCRIPTION OF THE DRAWINGS

Various non-limiting embodiments are further described with reference to the accompanying drawings in which:

FIGS. 3-4 illustrate an exemplary non-limiting embodiment of a green antenna (GA) comprising a light-focusing 3×2 suspended plate antenna (SPA) array element and a plurality of solar cell panels suspended above a V-shaped ground plane, in which FIG. 3 depicts a side view, and FIG. 4 depicts a top view;

FIGS. 5-6 depict a further non-limiting implementation of a GA, comprising a light-focusing 3×3 SPA array element and a plurality of solar cell panels suspended above a U-shaped ground plane according to aspects as described herein, in which FIG. 5 depicts a side view, and FIG. 6 depicts a top view;

FIG. 7 depicts a non-limiting parabolic reflector antenna fed by an exemplary horn antenna, and FIG. 8 illustrates an exemplary non-limiting solar cell comprising a coating or overlay as further described herein;

FIG. 9 depicts input impedance, and FIG. 10 depicts corresponding reflection coefficients;

FIG. 12 depicts simulated and measured normalized radiation patterns in an electric field reference plane (E-plane), and FIG. 13 depicts simulated and measured normalized radiation patterns in a magnetizing field reference plane (H-plane);

FIG. 22 depicts simulated and measured normalized radiation patterns in an E-plane, and FIG. 23 depicts simulated and measured normalized radiation patterns in an H-plane;

FIG. 25 depicts simulated and measured normalized radiation patterns in an E-plane, and FIG. 26 depicts simulated and measured normalized radiation patterns in an H-plane;

DETAILED DESCRIPTION

Overview

Figure 1:
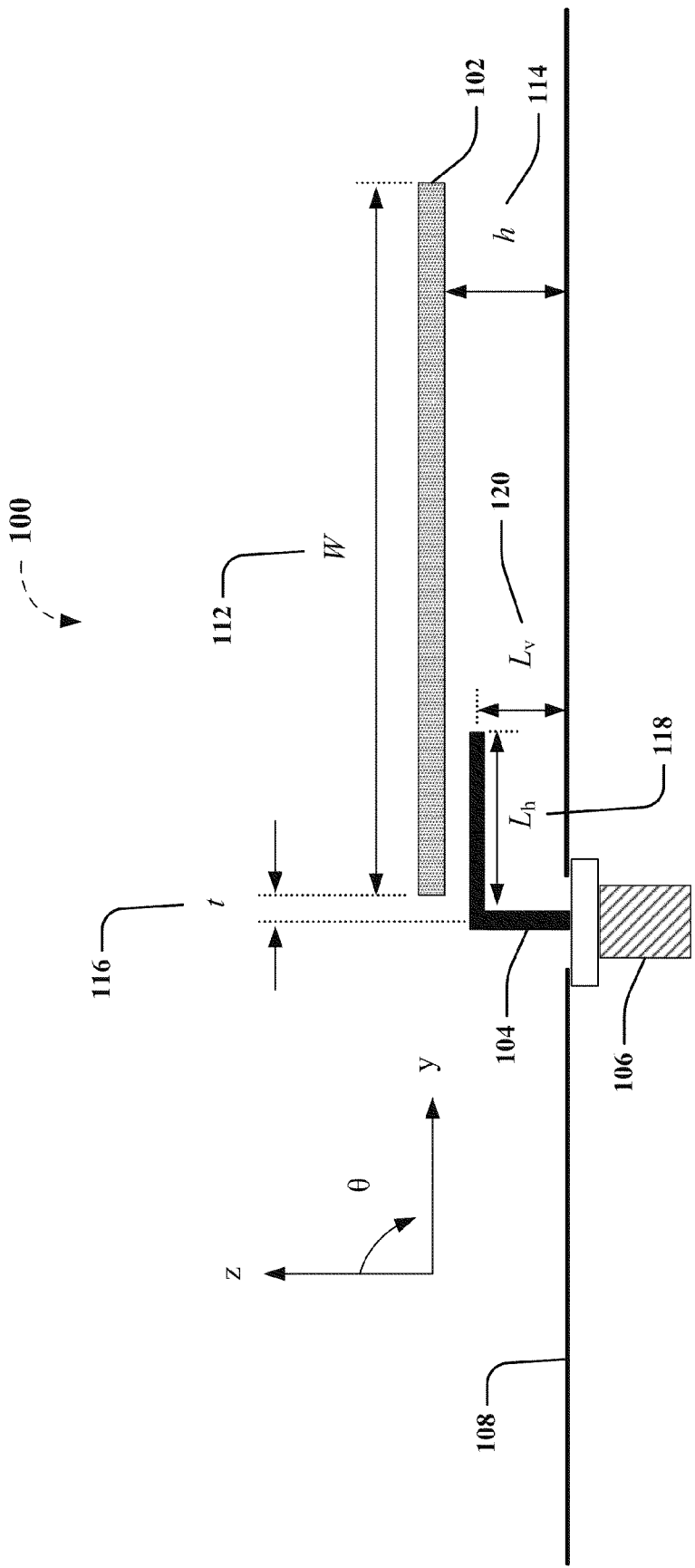
FIG. 1 depicts a side view of exemplary embodiments of suspended patch antennas (SPAs) as described herein.

While a brief overview is provided, certain aspects of the disclosed subject matter are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, systems and methodologies of the disclosed subject matter are described in the context of wireless communication systems and components. However, as further detailed below, various exemplary implementations can be applied to other areas of wireless communications, optical applications, without departing from the subject matter described herein.

As used herein, the term "Green Antenna (GA)" is intended to refer to a dual-function device that can be used simultaneously as an antenna for wireless communication or otherwise and as a solar power collection or generation system. As further used herein, the term "communication antenna(s)" are intended to refer to an antenna, an antenna substructure, or a subcomponent of an antenna suitable for communication of information over a transmission medium (e.g., a wireless transmission medium), such as for example, for communication of data, voice, video, radio beacons, and so on. As described in the background, local generation of renewable energy for communications systems can provide enhanced efficiency without sacrificing wireless communication system antenna characteristics. Thus, the disclosed subject matter provides systems, devices, and methodologies for solar energy collection and use in communications systems.

According to various embodiments of the disclosed subject matter, one or more solar cell(s) can be combined with an antenna structure, components, or subcomponents used for radiating functions, which can also act as a light reflector for the one or more solar cell(s). As referred to herein, such solar energy collection antennas can be called green antennas, in that, according to aspects, the disclosed embodiments can function as a communications antenna while generating power from solar energy.

For instance, exemplary non-limiting implementations can employ suspended plate antenna (SPA) arrays fabricated or otherwise placed on grounds (e.g., concave grounds) that can provide a light focusing effect. As an illustrative example, an L-shaped wire can be used as an efficient excitation probe for a C-figured loop antenna. For instance, a low profile (approximately $0.1\lambda_o$) L-probe-fed suspended patch antenna (SPA), where $\lambda_o$ is the wavelength in free space, can provide a very wide impedance bandwidth of more than 35%, with stable radiation patterns across the passband. As a further example, an SPA element can be excited in its fundamental broadside transverse magnetic ($TM_{01}$) mode by an L-probe. In addition, such SPA arrays can advantageously provide a low profile, lightweight, and ease of excitation and tuning, in addition to facilitating an increase in antenna gain.

According to an aspect, an antenna structure and its associated ground plane can act as a light-reflecting surface for one or more solar cell(s). For example, in various embodiments one or more SPA arrays can be built on ground planes (e.g., non-planar ground planes) that facilitate focusing light for use by one or more solar cell(s). Thus, the ground planes (e.g., non-planar ground planes) light-focusing effects can result in relatively larger output voltages can be obtained from the solar cell systems. The increased voltage can be as much as approximately 80% higher than that without the green antennas. In a further aspect, an SPA element can be excited by an L-probe that can facilitate wideband microwave operation of antenna structures, for which, simulated and measured reflection coefficients, input impedance, antenna gains, and radiation patterns of disclosed embodiments indicate beneficial use in systems that require self-sustained power (e.g., wireless communication systems, etc.).

In further embodiments described herein, one or more solar cell(s) can be directly fabricated or otherwise placed on a surface of a dish (e.g., a substantially parabolic reflecting dish). Advantageously, such embodiments provide a space-efficient power generation capability as virtually no additional space is required to house the solar generation capabilities.

According to an aspect, implementations of the disclosed subject matter provide self-sustaining power to wireless systems employing such implementations. As a further advantage, the dual function characteristic (e.g., radiating for wireless communication and solar energy focusing or collecting) can result in cost reductions in the design, fabrication, and/or operation of systems employing such implementations.

Figure 2:
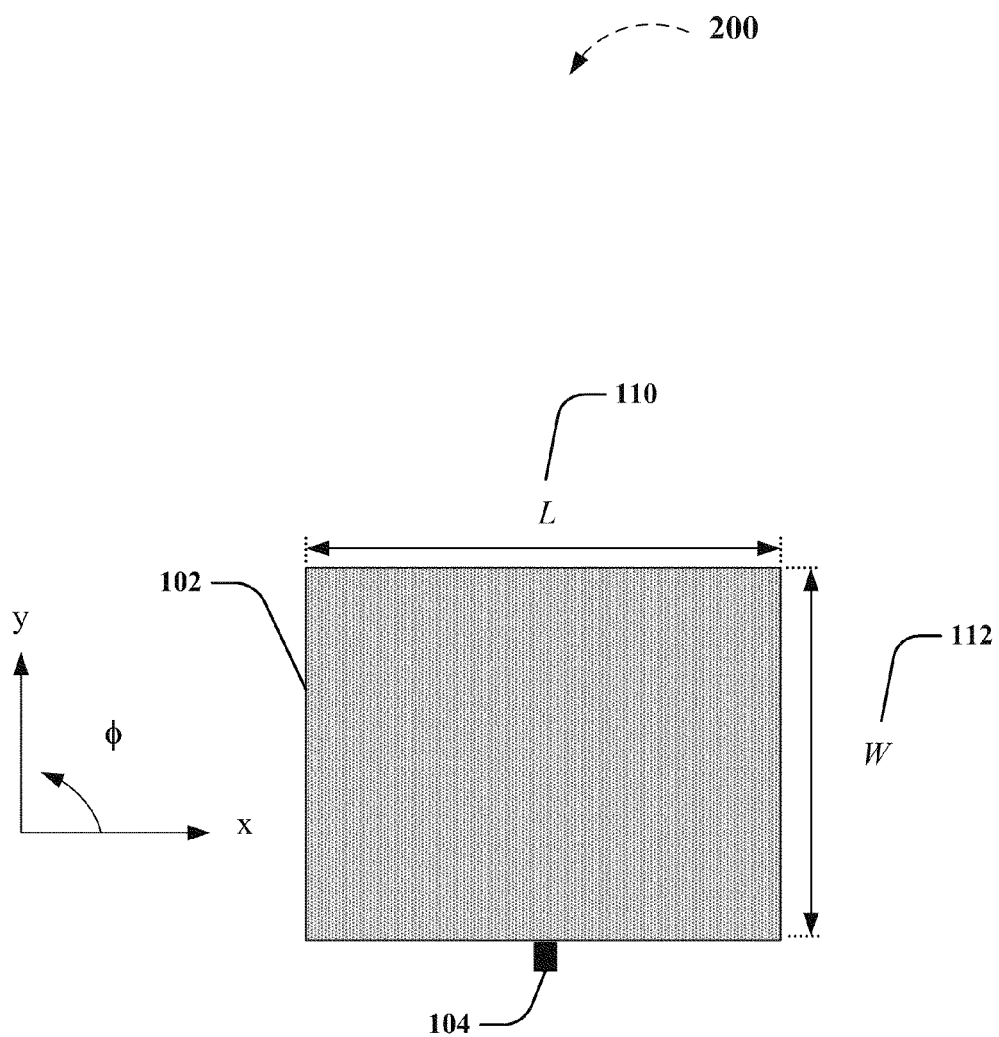
FIG. 2 depicts a top view illustrating further aspects of exemplary implementations of disclosed SPAs.

Accordingly, FIG. 1 depicts a side view of exemplary embodiments of suspended patch antennas (SPAs) 100 as described herein. FIG. 2 depicts a top view 200 illustrating further aspects of exemplary implementations of disclosed SPAs. Thus, FIG. 1 depicts a single-element 102 SPA fed by an L-probe 104 connected to a connector 106 (e.g., SMA (SubMiniature version A) connector) and supported by a ground plane 108. As further described below, implementations of exemplary embodiments 100 can be employed in various configurations including disclosed implementations, for example, to provide the dual function characteristics as described herein.

For instance, according to various embodiments of the disclosed subject matter, both single-element 102 SPA and ground plane 108 can advantageously reflect incident light to one or more appropriately positioned solar cell(s) to increase output voltage of a solar power generating system. According to an aspect, SPA 100 can be optimized at a frequency of interest (e.g., 2 GigaHertz (GHz)). In addition, according to an aspect, SPA 100 can be fabricated with approximate dimensions of L (110)=100 millimeters (mm), W (112)=54 mm, h (114)=18 mm, t (116)=1.5 mm, $L_h$ (118)=21.5 mm, and $L_v$ (120)=11.9 mm.

Exemplary Solar Energy Collection Antennas

Figure 3:
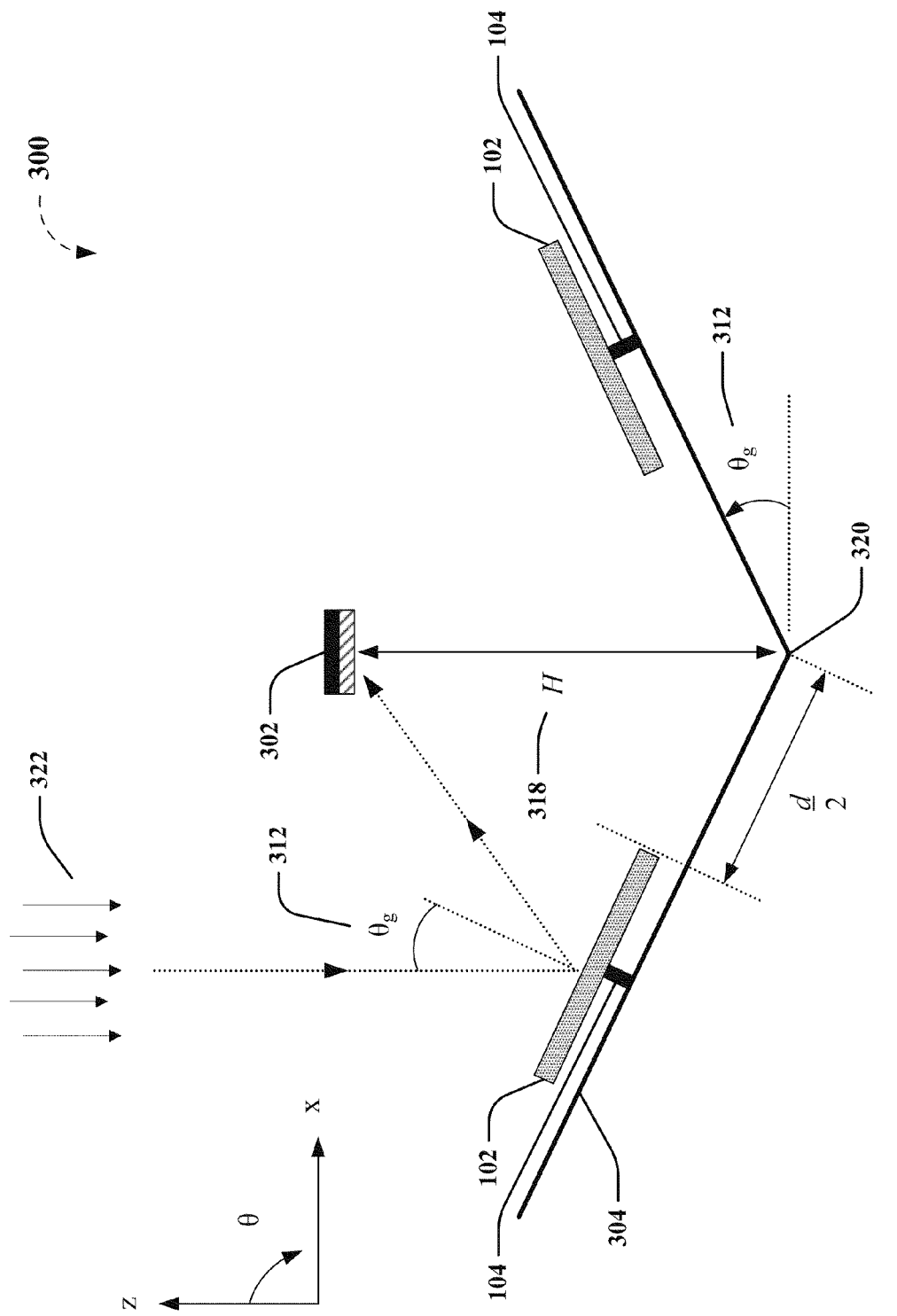
Figure 4:
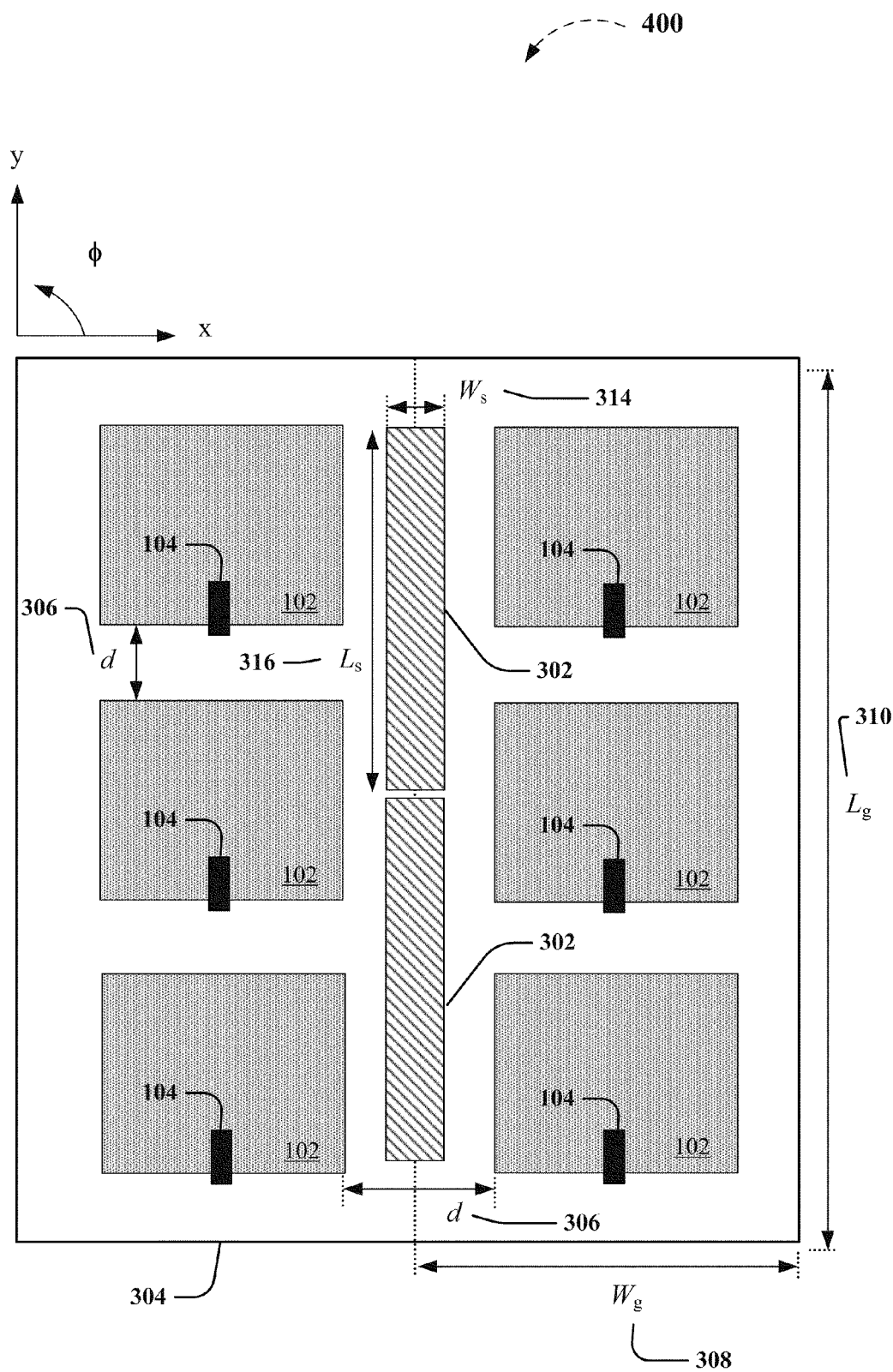

FIGS. 3-4 illustrate an exemplary non-limiting embodiment of a green antenna (GA) 300 comprising a light-focusing 3×2 SPA array element and a plurality of solar cell panels 302 suspended above a V-shaped ground plane 304, in which FIG. 3 depicts a side view 300, and FIG. 4 depicts a top view 400. According to an aspect, GA 300 can comprise a 3×2 array consisting of 6 SPA 102 radiating elements placed on a V-shaped concave ground plane 304. According to various embodiments, GA 300 can be fabricated with approximate parameters of d (306)=70 mm, $W_g$ (308)=180 mm, $L_g$ (310)=458 mm, and $\theta_g$ (312)=5 degrees (°) as depicted. According to further embodiments, one or more solar cell panel(s) 302 (e.g., one-sided amorphous solar cell panel(s)) of $W_s$ (314)=60 mm, $L_s$ (316)=150 mm can be electrically connected (e.g., electrically connected in parallel) and can be suspended above the V-shaped concave ground 304 at a distance of H 318.

For instance, in exemplary non-limiting embodiment of GA 300, one or more solar cell panel(s) 302 can be fixed in a suspended position above the V-shaped concave ground 304 at a distance of H 318 using a holder (e.g., a polyvinylchloride (pvc) holder) (not shown) at an approximate height of H (318)=41 centimeters (cm) above a vertex 320 of ground plane 304. According to various embodiments, H 318 can be determined (e.g., experimentally or otherwise) by optimizing output of the one or more solar cell panel(s) 302. As described above, both single-element(s) 102 SPA and ground plane 304 can advantageously reflect incident light 322 to one or more appropriately positioned solar cell(s) 302 to increase output voltage of an associated solar power generating system.

Figure 5:
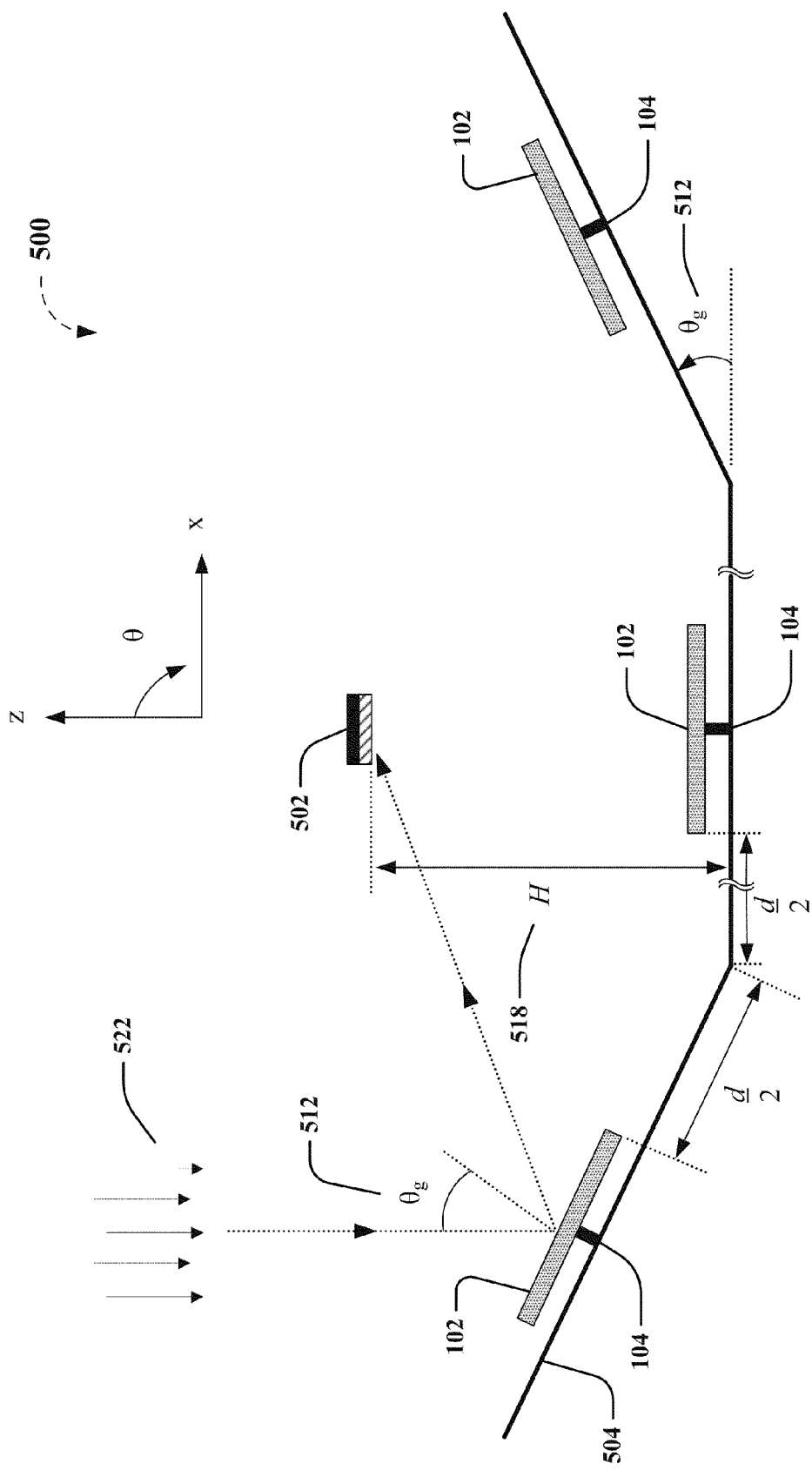
Figure 6:
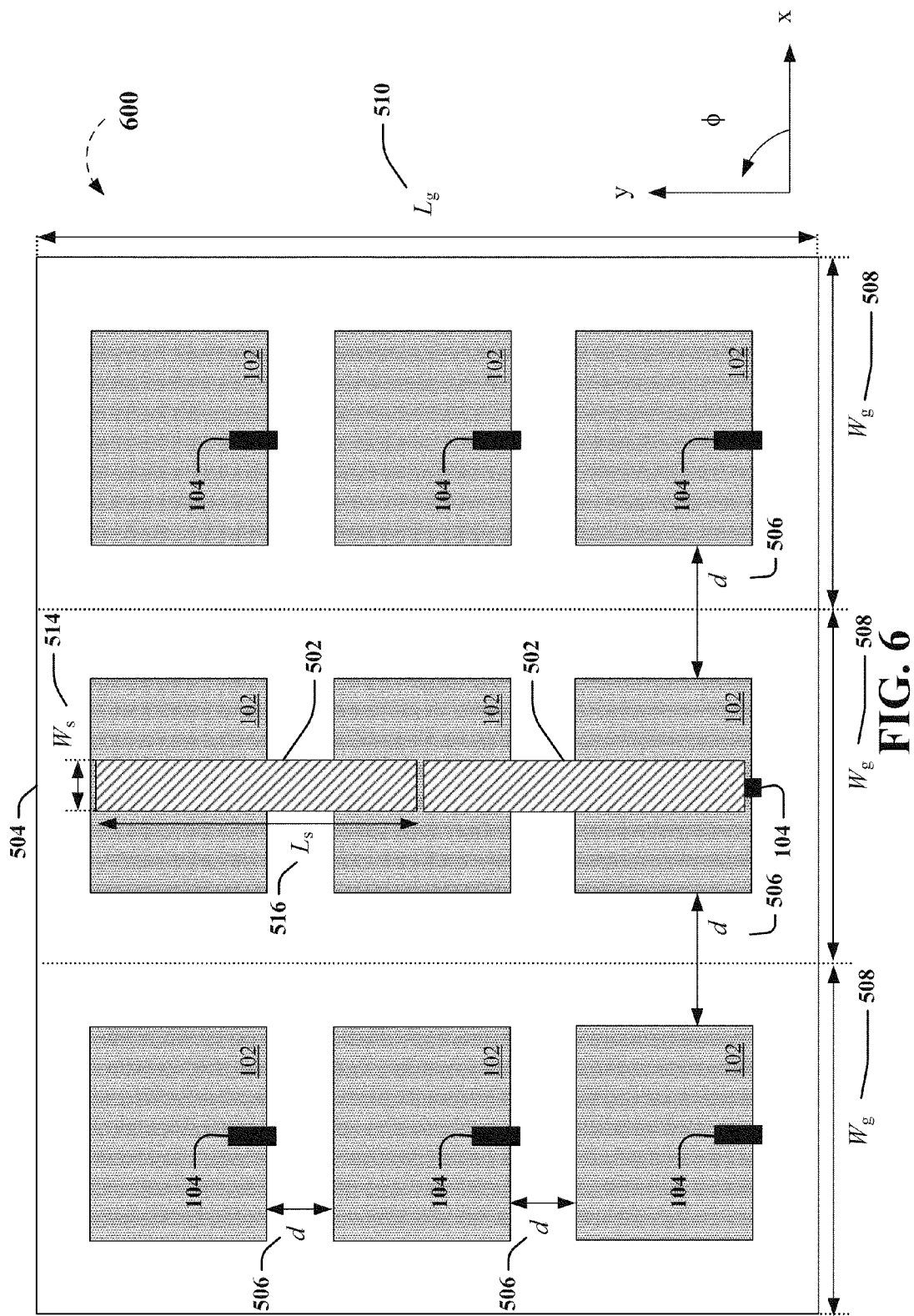

FIGS. 5-6 depict a further non-limiting implementation of a GA 500, comprising a light-focusing 3×3 SPA array element and a plurality of solar cell panels 502 suspended above a U-shaped ground plane 404 according to aspects as described herein, in which FIG. 5 depicts a side view 500, and FIG. 6 depicts a top view 600. According to an aspect, GA 500 can comprise a 3×3 array consisting of 9 SPA 102 radiating elements placed on a U-shaped concave ground plane 504. According to various embodiments, GA 500 can be fabricated with approximate parameters of d (506)=70 mm, $W_g$ (508)=180 mm, $L_g$ (510)=458 mm, $\theta_g$ (512)=10° as depicted. According to further embodiments, one or more solar cell panel(s) 502 (e.g., one-sided amorphous solar cell panel(s)) of $W_s$ (514)=60 mm, $L_s$ (516)=150 mm can be electrically connected (e.g., electrically connected in parallel) and can be suspended above the V-shaped concave ground 504 at a distance of H 518.

As an example, in exemplary non-limiting implementation of GA 500, one or more solar cell panel(s) 502 can be fixed in a suspended position above the U-shaped concave ground 504 at a distance of H 518 using a holder (e.g., a polyvinylchloride (pvc) holder) (not shown) at an approximate height of H (518)=47 centimeters (cm) above ground plane 504 as depicted. According to various implementations, H 518 can be determined (e.g., experimentally or otherwise) by optimizing output of the one or more solar cell panel(s) 502. As described above, both single-element(s) 102 SPA and ground plane 504 can advantageously reflect incident light 522 to one or more appropriately positioned solar cell(s) 502 to increase output voltage of an associated solar power generating system.

Figure 7:
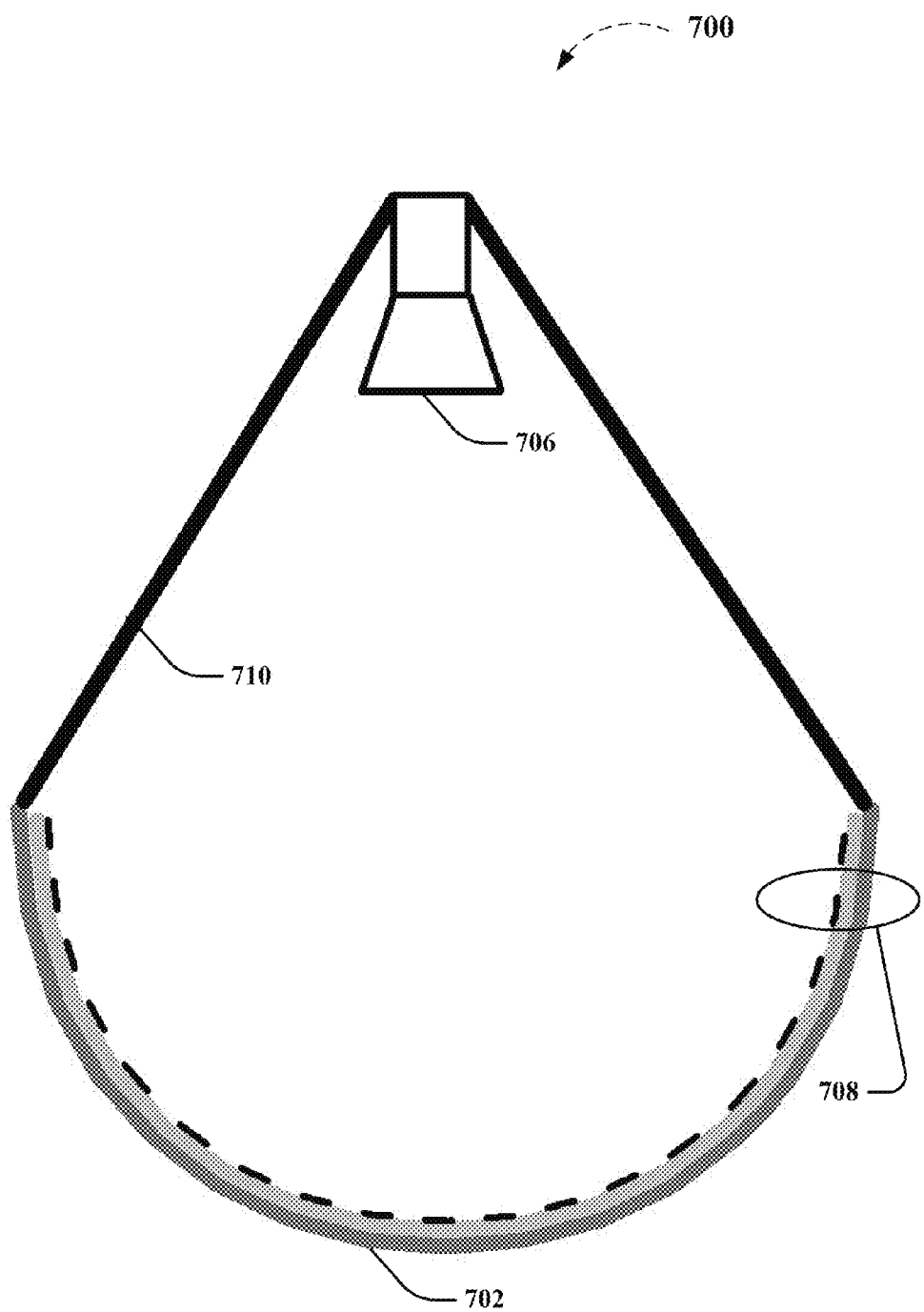
FIGS. 7-8 depict yet another exemplary implementation of a GA, comprising a non-limiting parabolic reflector antenna and a conformal overlaid solar cell according to further aspects as described herein, where
Figure 8:
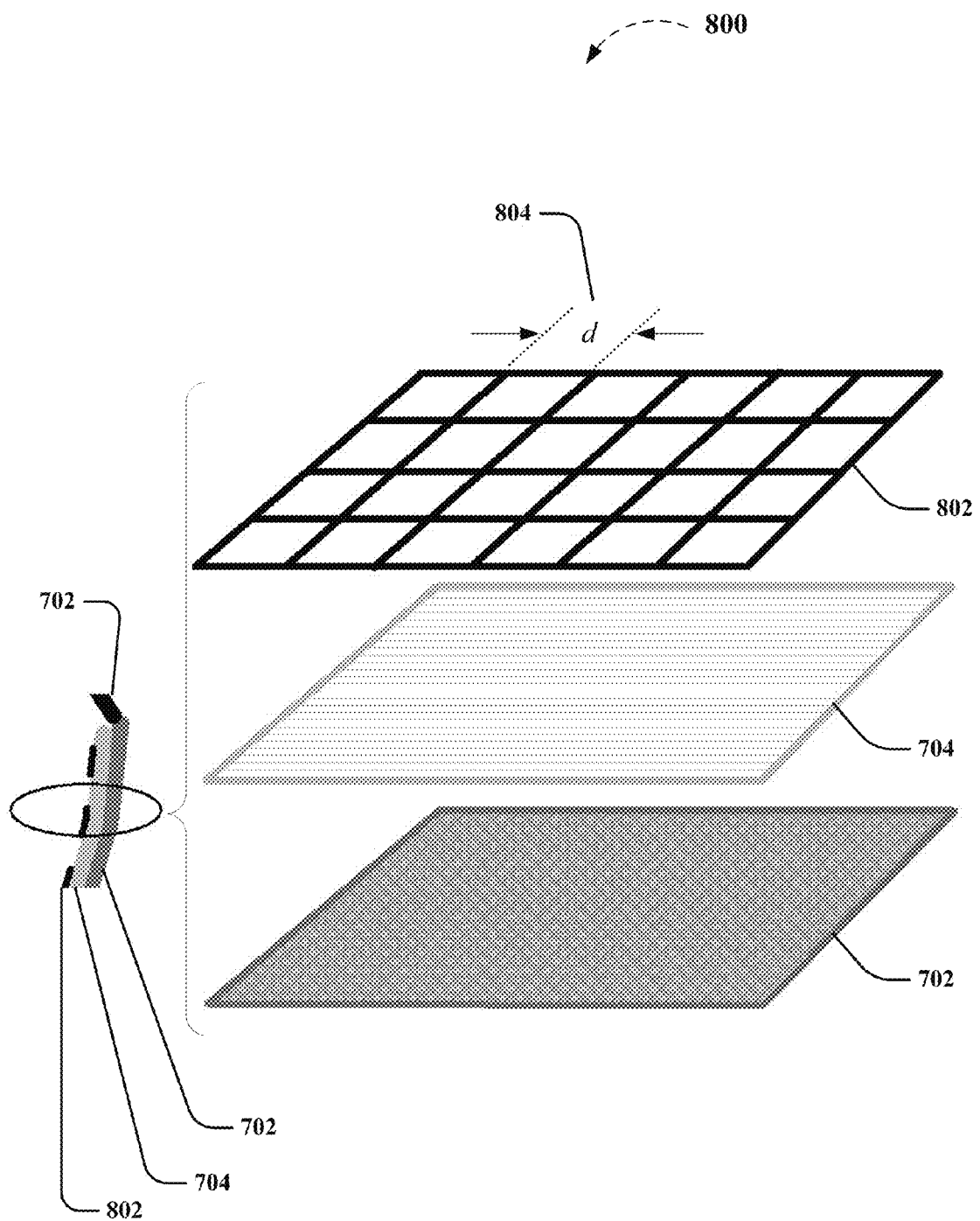

FIGS. 7-8 depict yet another exemplary implementation of a GA 700, comprising a non-limiting parabolic reflector 702 antenna and one or more conformal overlaid solar cell(s) 704 according to further aspects as described herein, where FIG. 7 depicts a non-limiting parabolic reflector 702 antenna fed by an exemplary antenna 706 (e.g., a horn antenna), and FIG. 8 illustrates an exemplary non-limiting conformal overlaid solar cell structure 800 (of detail 708) comprising a coating or overlay 802 that can facilitate transmission of light while reflecting one or more of Radio Frequency (RF), microwave, or millimeter-wave signals to exemplary antenna 706 (e.g., a horn antenna).

Thus, according to various implementations, the GA 700 can comprise a parabolic reflector 702 (e.g., a substantially parabolic reflector comprised of a metallic reflector, etc.) antenna fed by an exemplary antenna 706 (e.g., a horn antenna) that can be supported by holder or support 710. In an aspect, GA 700 can further comprise one or more conformal overlaid solar cell(s) 704. In addition, one or more conformal overlaid solar cell(s) 704 can be fabricated, placed on, or otherwise attached to the parabolic reflector 702 antenna and under a coating or overlay 802 that permits transmission of light but reflects one or more of Radio Frequency (RF), microwave, or millimeter-wave signals to exemplary antenna 706 (e.g., a horn antenna).

For instance, according to an aspect, one or more conformal overlaid solar cell(s) 704 can include coating or overlay 802, for example, that can be a metallic wire grid. As a further example, coating or overlay 802 can include a metallic wire grid having grid size of d 804. It can be understood that a coating or overlay 802 comprising a metallic wire grid having grid size of d 804 can strongly reflect a microwave signal over a frequency range of $f_L \leq f \leq f_H$ when the grid size 804 is less than $1/(10f_H)$. Thus, according to a further aspect, coating or overlay 802 can be selected such that grid size or other physical properties can maximize reflection of incident radiation of interest (e.g., wireless communications carrier signal such as a microwave signal), while maximizing solar generation capability.

Thus, as described above, various implementations of the disclosed subject matter (e.g., GA 300, GA 500, GA 700, etc.) can provide self-sustaining power to wireless systems employing such implementations. As a further advantage, the dual function characteristic (e.g., radiating for wireless communication and solar energy focusing or collecting) can result in cost reductions in the design, fabrication, and/or operation of systems employing such implementations.

Figure 9:
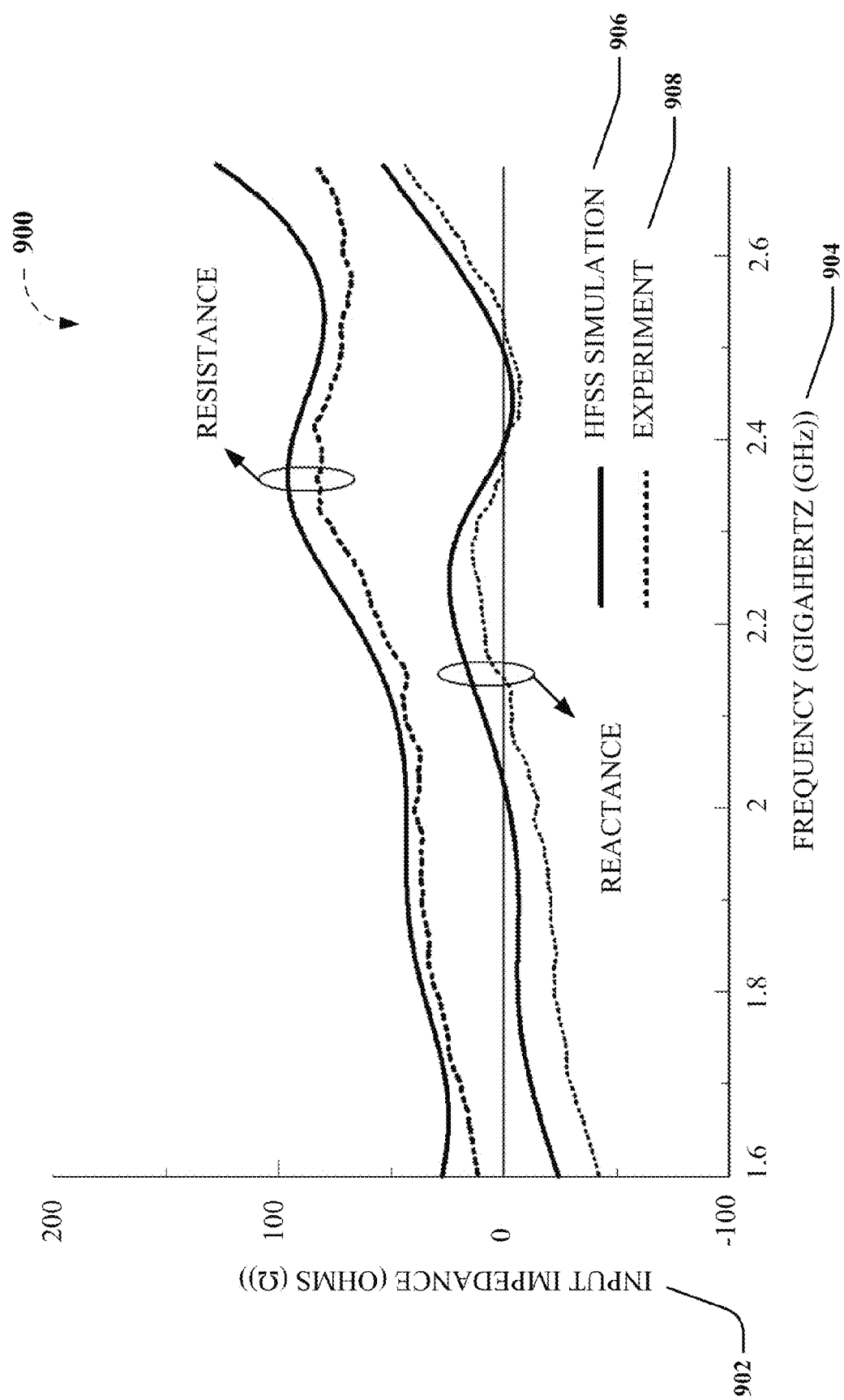
FIGS. 9-10 depict simulated and measured characteristics of an exemplary non-limiting single-element SPA, where
Figure 10:
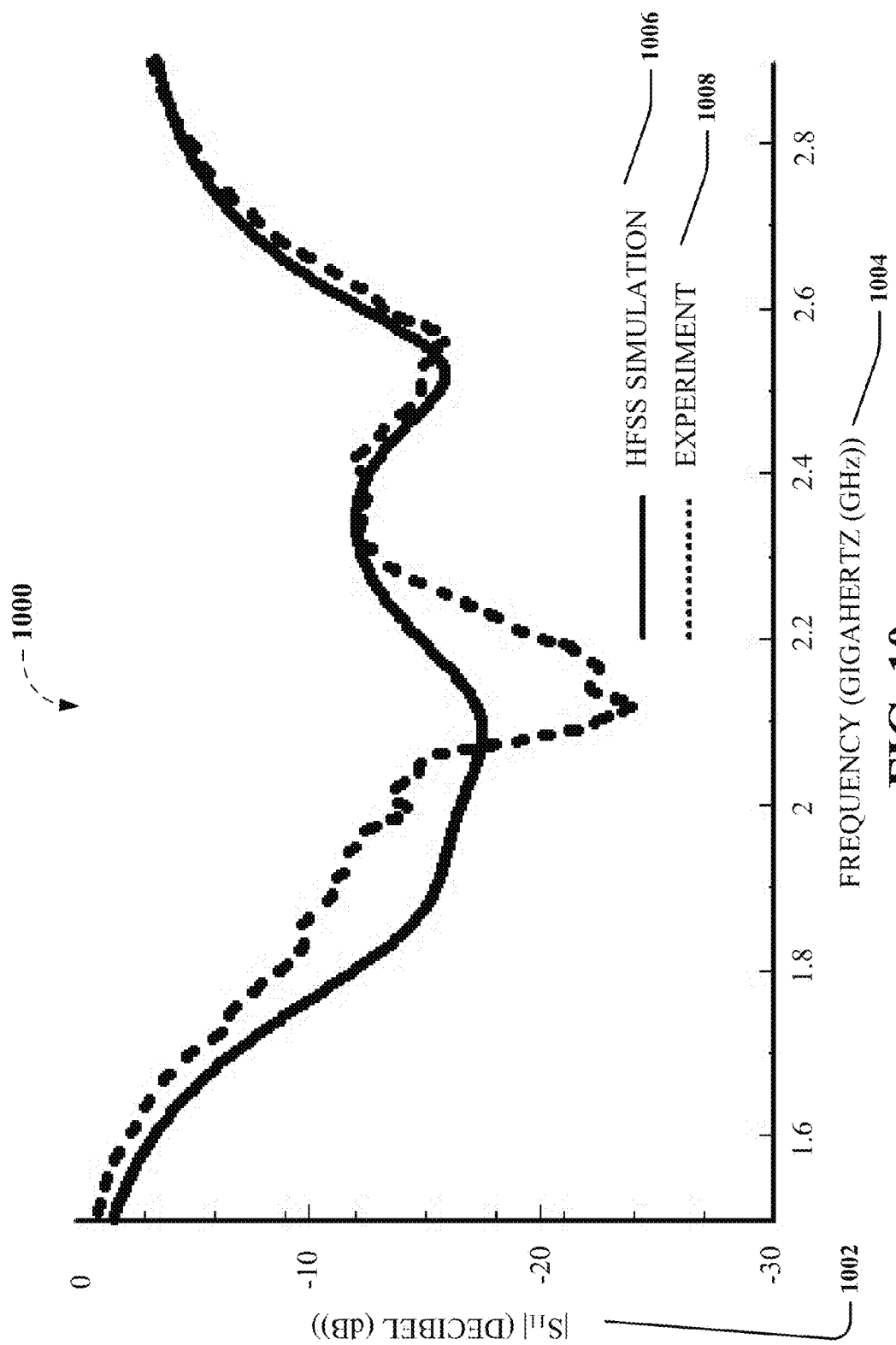

For instance, FIGS. 9-10 depict simulated and measured characteristics of an exemplary non-limiting single-element 102 SPA, where FIG. 9 depicts input impedance 902 as a function of frequency 904, and FIG. 10 depicts corresponding reflection coefficients 1002 as a function of frequency 1004 for both simulations 906 (1006) and experimental measurements 908 (1008). Accordingly, for an exemplary single-element 102 SPA resting on a 20×20 square centimeters (cm²) flat ground plane, for example, as described above regarding FIGS. 1-2, the exemplary single-element 102 SPA can be simulated and/or optimized using Ansoft™ HFSS™. In addition, experimental measurements can be acquired using an Agilent® 8753 network analyzer to verify simulations.

As can be seen from FIG. 9, the simulated 906 and measured 908 input impedance demonstrate acceptable agreement. From the corresponding reflection coefficients 1002 of FIG. 10, it can be seen that the measured 1008 and simulated 1006 antenna bandwidths ($|S_{11}|<-10$ dB) are approximately 38% and 42%, respectively. In addition, from FIG. 10, two resonant modes are observed. The first resonance is caused by the $TM_{01}$ mode of the exemplary single-element 102 SPA, which can be verified by examining its electric field distribution. Its measured 1008 and simulated 1006 frequencies (min. $|S_{11}|$) are given by 2.12 GHz and 2.09 GHz (1.43% error), respectively.

The second resonance is found at approximately 2.5 GHz. It can be understood that this mode can be caused by the L-probe, for example, because its frequency agrees reasonably with 2.25 GHz estimated using a primitive formula of $f=c/[4(L_h+L_v)]$, where c is the speed of light in vacuum. The discrepancy between the two frequencies can be further understood by noting the fact that the primitive formula does not take into account the effect of the suspended patch. According to various embodiments of the disclosed subject matter, exemplary GAs can employ the first resonant mode (e.g., resonance caused by the $TM_{01}$ mode of the exemplary single-element 102 SPA).

Figure 11:
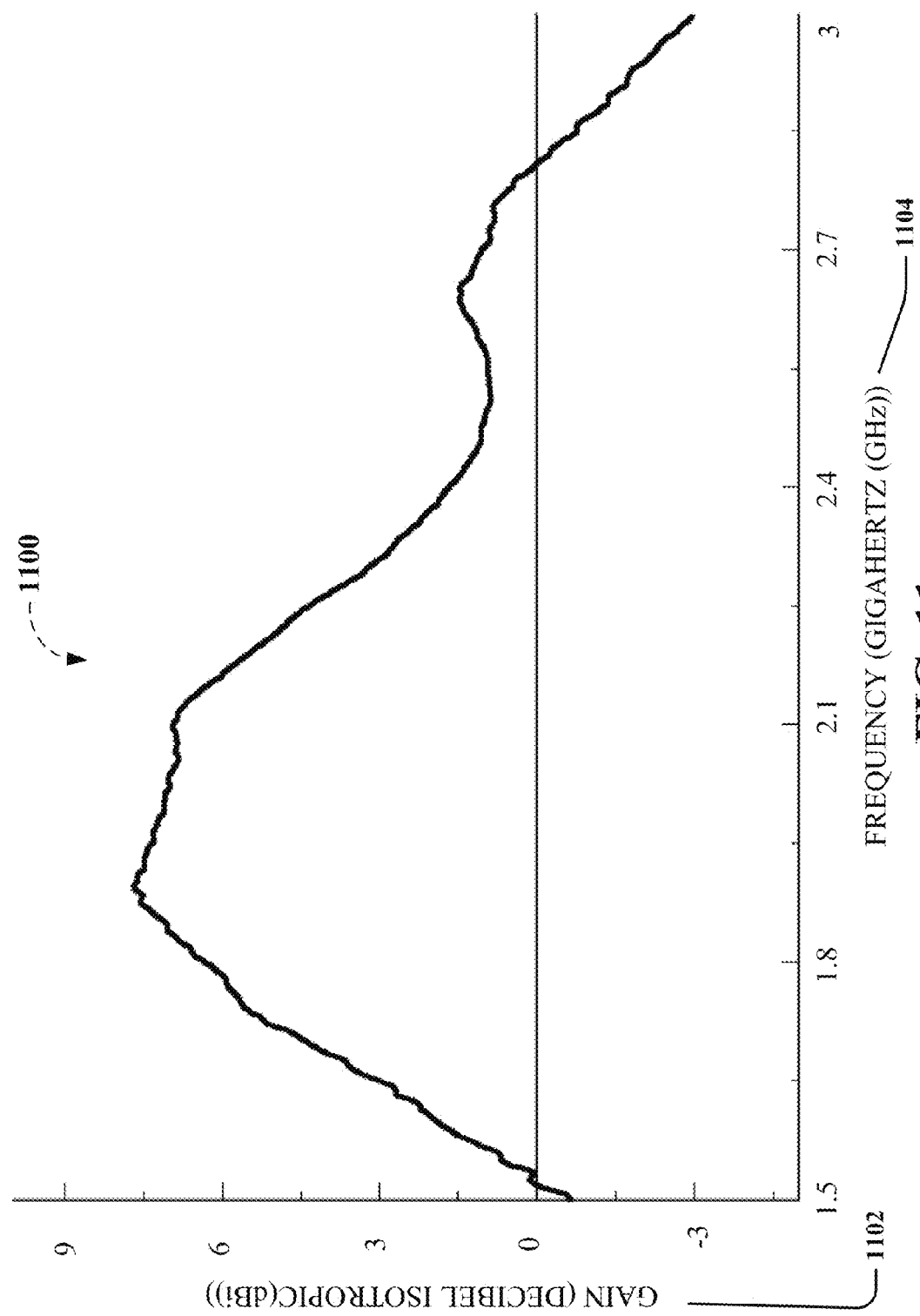
FIG. 11 depicts measured antenna gain for an exemplary non-limiting single-element SPA.

FIG. 11 depicts measured antenna gain 1102 as a function of frequency 1104 for an exemplary non-limiting single-element 102 SPA. It can be seen from FIG. 11 that the gain is approximately 7 Decibel Isotropic (dBi) around the SPA mode, as expected for the dominant TM mode of the exemplary non-limiting single-element 102 SPA.

Figure 12:
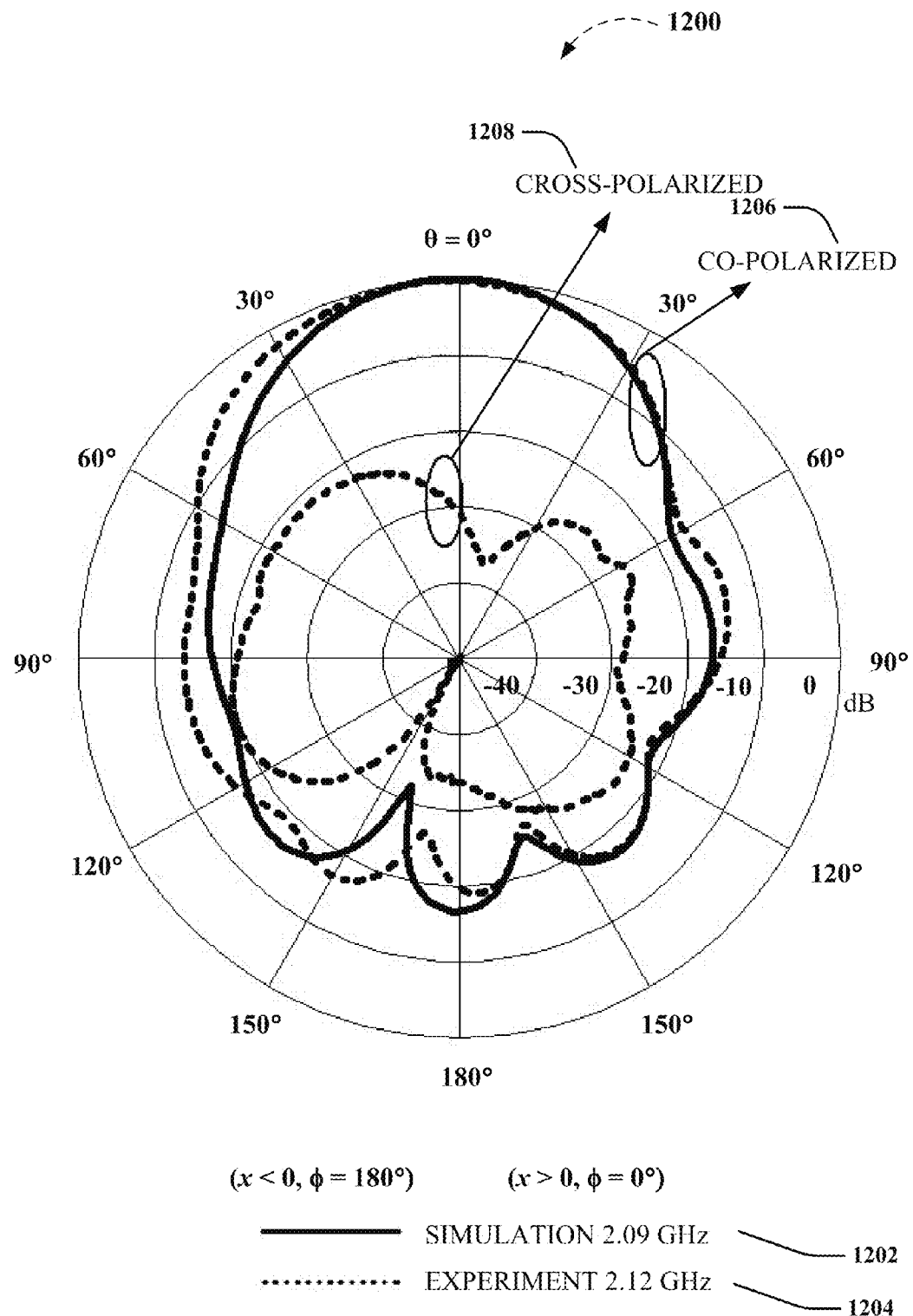
FIGS. 12-13 depict simulated and measured normalized radiation patterns of an exemplary non-limiting single-element SPA, where
Figure 13:
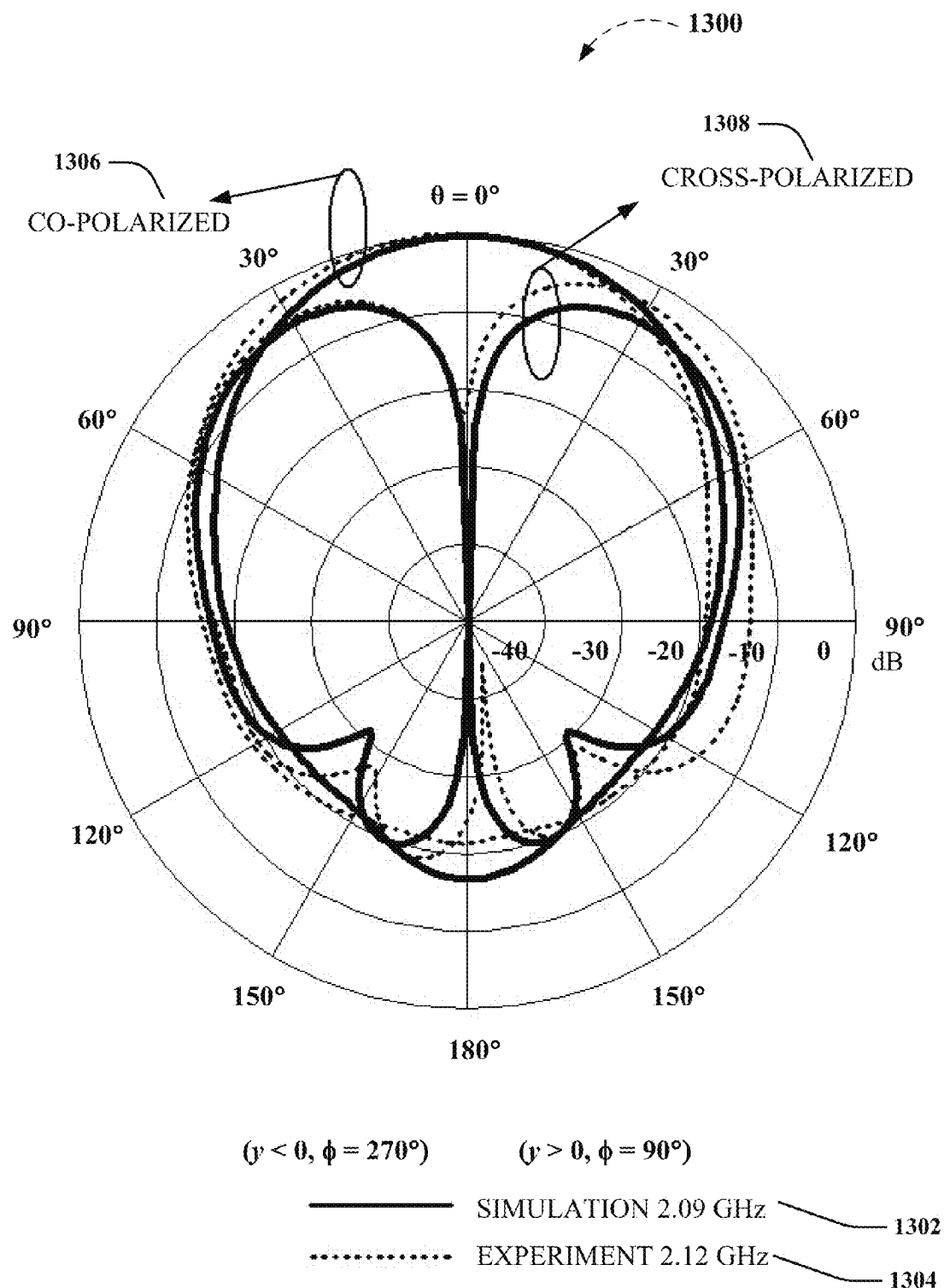

FIGS. 12-13 depict simulated and measured normalized radiation patterns of an exemplary non-limiting single-element 102 SPA, where FIG. 12 depicts 1200 simulated 1202 and measured 1204 normalized radiation patterns in an electric field reference plane (E-plane), and FIG. 13 depicts 1300 simulated 1302 and measured 1302 normalized radiation patterns in a magnetizing field reference plane (H-plane). Broadside patterns can be observed for both E- and H-planes, as expected, and co-polarized fields 1206 (1306) are stronger than their cross-polarized 1208 (1308) counterparts by at least 20 Decibel (dB) in the boresight direction ($\theta=0°$. Note further that the simulated 1202 E-plane cross-polarized field is too minute to observe in FIG. 12.

Figure 14:
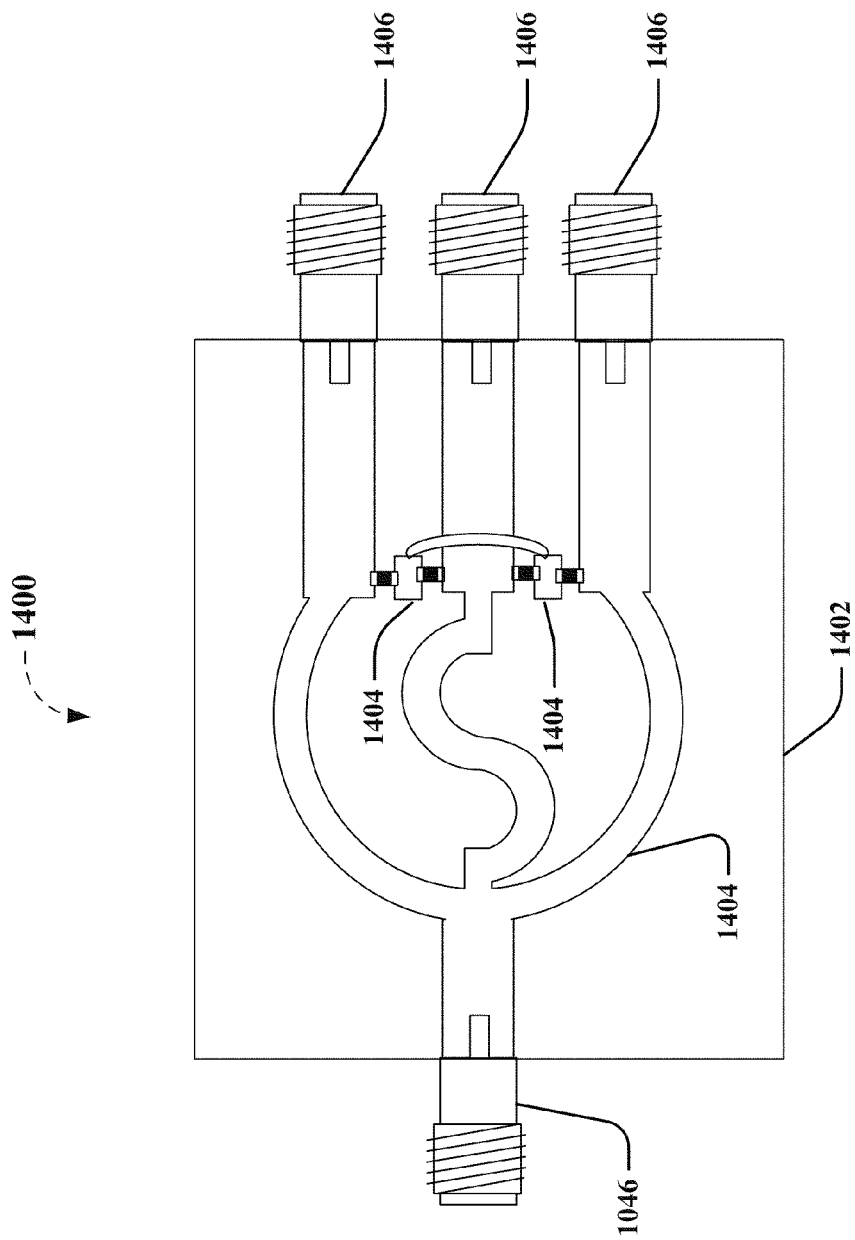
FIG. 14 illustrates a top view of a non-limiting one-to-three way Wilkinson power divider suitable for use with exemplary implementations of the disclosed subject matter.

FIG. 14 illustrates a top view of a non-limiting one-to-three way Wilkinson power divider 1400 suitable for use with exemplary implementations of the disclosed subject matter. For instance, to feed exemplary non-limiting single-element 102 SPA of various implementations of the disclosed subject matter (e.g., GA 300, GA 500, GA 700, etc.), a plurality of conventional one-to-three way Wilkinson power dividers can be fabricated or otherwise obtained and cascaded. To that end, non-limiting one-to-three way Wilkinson power divider 1400

FIG. 14 can comprise a substrate 1402 supporting a plurality of electrical traces 1404 associated circuit components and connectors 1406 (e.g., SMA connectors).

Figure 15:
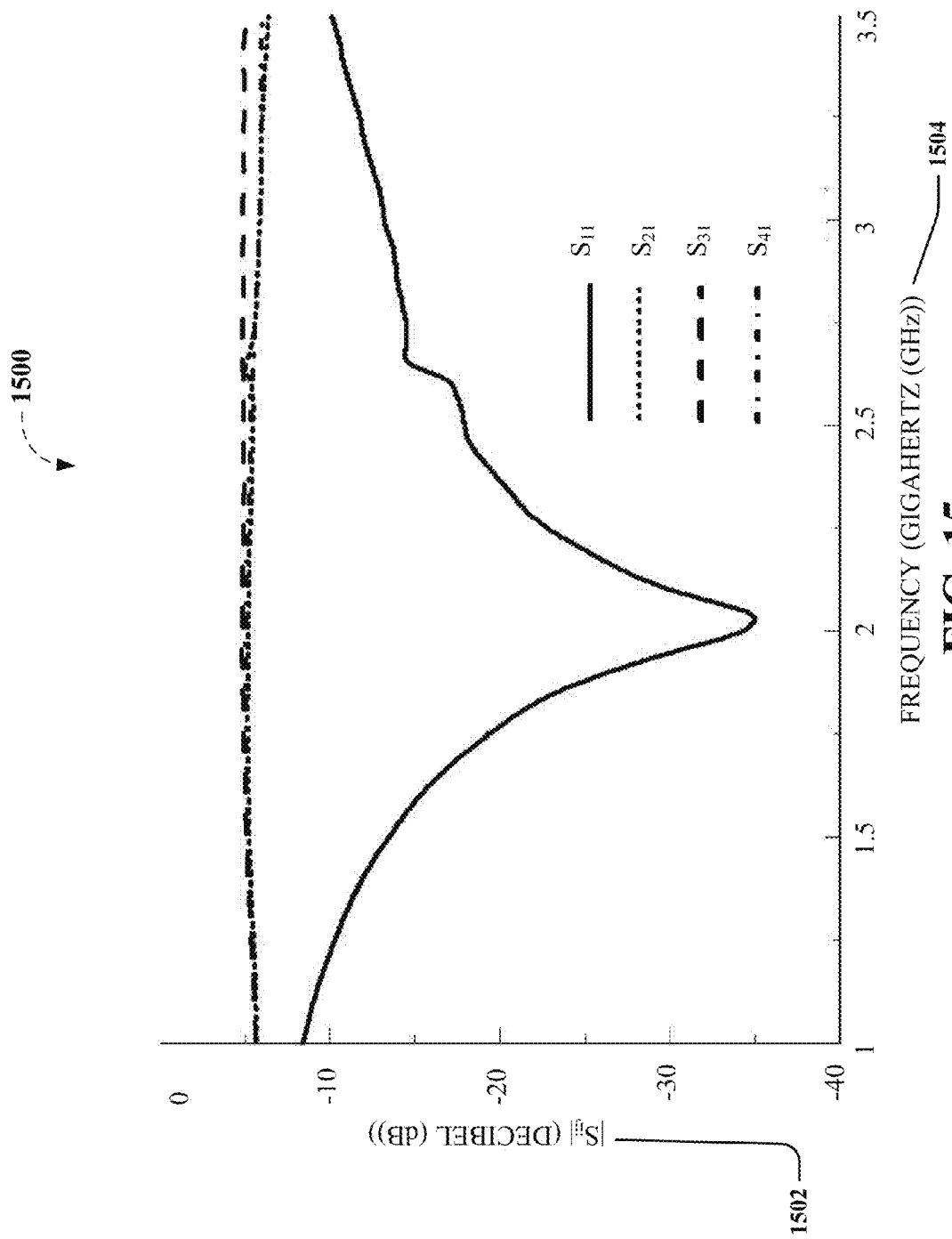
FIGS. 15-16 depict measured scattering parameters (S parameters) of a non-limiting one-to-three-way Wilkinson power divider.
Figure 16:
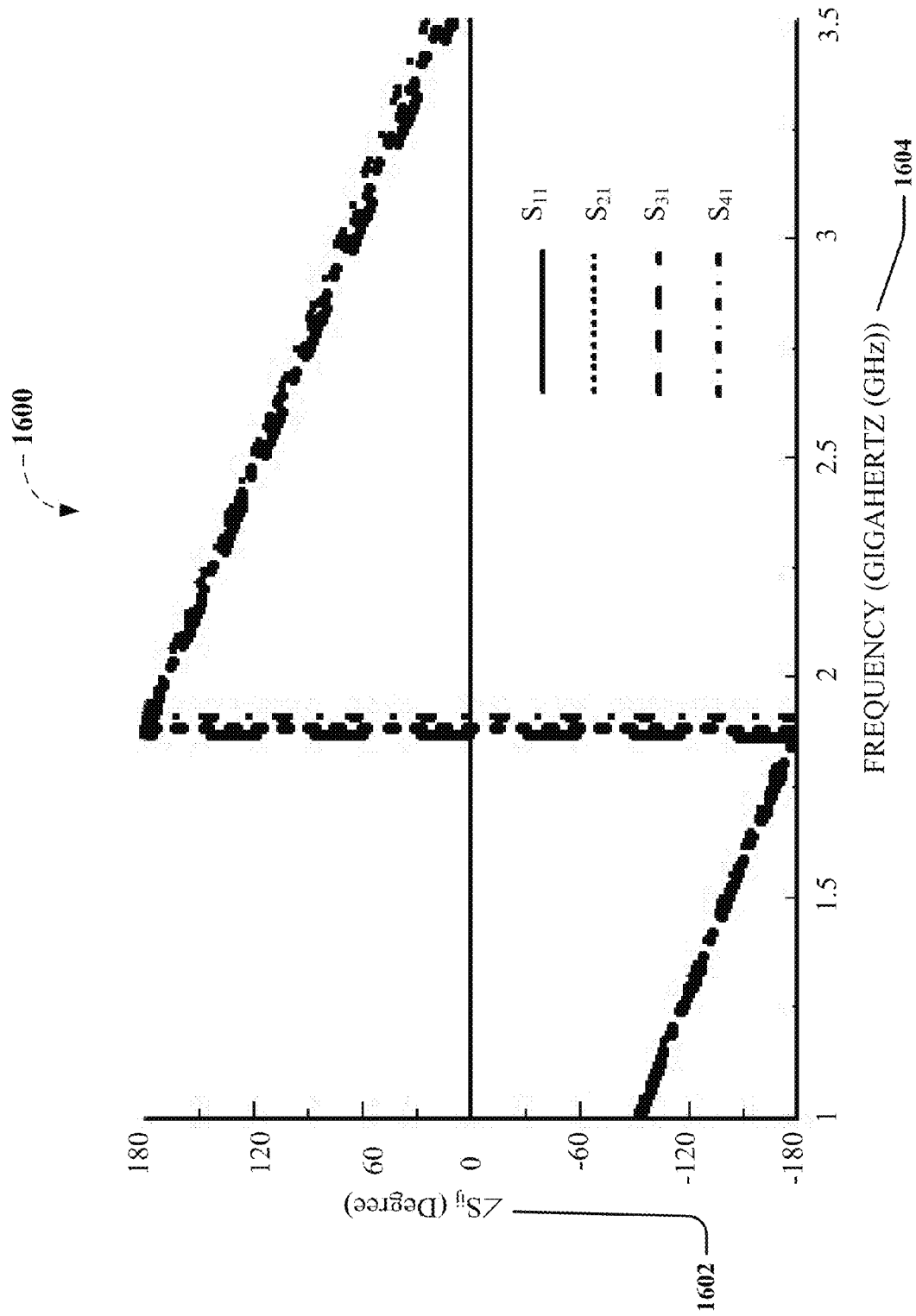

FIGS. 15-16 depict measured scattering parameters (S parameters) 1502 (1602) as a function of frequency 1504 (1604) for a non-limiting one-to-three-way Wilkinson power divider 1400. While S simulated parameters results agree with the measurements, the comparison is omitted for brevity. As can be observed in FIGS. 15-16, the magnitude passband of the power divider is from 1.45 GHz to 2.23 GHz (=−4.77±0.5 dB, i=2, 3, or 4), giving a bandwidth of approximately 0.78 GHz. The measured phase bandwidth ($\angle S_{i1}$ − $\phi S_{j1}$|)<5°, i,j>1 and i≠j) is given by 2 GHz (1 GHz-3 GHz), which is much wider than the magnitude bandwidth. Thus, it can be understood that the overall bandwidth of non-limiting one-to-three-way Wilkinson power divider 1400 is limited by its magnitude response.

Thus, according to various embodiments, the disclosed subject matter provides solar energy collection antennas (e.g. GA 300, GA 500, GA 700, etc.). For example, according to non-limiting implementations, a solar energy collection antenna as described above regarding FIGS. 3-6 can comprise, a reflective ground plane (e.g., ground plane 108, a non-planar reflective ground plane such as V-shaped concave ground plane 304, U-shaped concave ground plane 504, and the like, etc.) that can be adapted to reflect incident solar radiation (e.g., incident light 322 (522), etc.) (e.g., a first portion of incident solar radiation) thereby resulting in reflected solar radiation. As a further example, solar energy collection antenna can include one or more antenna element(s) (e.g., SPA 102, associated L-probe 104, associated connector 106, subcomponents and/or combinations thereof, etc.) coupled to the reflective ground plane (e.g., ground plane 108, a non-planar reflective ground plane such as V-shaped concave ground plane 304, U-shaped concave ground plane 504, and the like, etc.).

In addition, as described above, solar energy collection antenna can further include one or more solar cell(s) (e.g., one or more solar cell(s) 302, one or more solar cell(s) 502, etc.). In an aspect, the one or more solar cell(s) can be positioned proximate to the reflective ground plane as described above regarding determination of H and θ with respect to FIGS. 3-6, thus facilitating receipt of reflected solar radiation.

According to further non-limiting implementations of solar energy collection antenna, the one or more antenna element(s) (e.g., SPA 102, etc.) can be configured to reflect a portion of the incident solar radiation (e.g., incident light 322 (522), etc.) (e.g., a second portion) to increase the reflected solar radiation. As further described above, the one or more antenna element(s) (e.g., SPA 102, etc.) can be adapted to receive excitation via an L-probe 104 proximate to the ground plane (e.g., ground plane 108, a non-planar reflective ground plane such as V-shaped concave ground plane 304, U-shaped concave ground plane 504, and the like, etc.).

In yet other non-limiting implementations of solar energy collection antenna, one or more antenna element(s) (e.g., SPA 102, etc.) can be configured into an array of antenna element(s). As an example, further implementations can employ six antenna element(s) (e.g., reflective SPA 102 elements) in a three by two array arranged on V-shaped reflective ground plane 304 as further described above regarding FIGS. 3-4. In yet another non-limiting example, implementations can employ nine antenna element(s) (e.g., reflective suspended plate antenna (SPA) 102 elements) in a three by three array arranged on U-shaped reflective ground plane 504 as further described above regarding FIGS. 5-6.

According to further non-limiting implementations, the disclosed subject matter provides solar energy collection antennas (e.g. GA 700, etc.). For example, according to exemplary implementations, a solar energy collection antenna as described above regarding FIGS. 7-8 can comprise a reflector structure configured or adapted to support one or more conformal solar cell(s) adjacent to the reflector structure. For instance, regarding FIGS. 7-8 a reflector structure can comprise reflector 702 that can support one or more conformal solar cell(s) (e.g., one or more conformal overlaid solar cell(s) 704, etc.). While, for purposes of illustration and not limitation, the reflector 702 is depicted and described as a parabolic reflector 702, it can be understood that the disclosed subject matter is not so limited. For instance, it is contemplated that virtually any reflector structure (e.g., whether configured as a non-planar reflector structure, or otherwise, a parabolic reflector structure, a substantially parabolic reflector structure, or otherwise, etc.) can function as reflector 702 to support one or more conformal solar cell(s) adjacent to the reflector structure.

As a further example, solar energy collection antenna can further comprise a selective transmission layer (e.g., a coating or overlay 802, etc.) adjacent to the one or more conformal solar cell(s). For instance, according to an aspect, solar energy collection antenna can comprise a selective transmission layer positioned on a side of the one or more conformal solar cell(s) (e.g., one or more conformal overlaid solar cell(s) 704, etc.) opposite the reflector structure (e.g., reflector 702). In a further aspect, selective transmission layer (e.g., a coating or overlay 802, etc.) can be adapted or configured to transmit a portion of incident solar radiation (e.g., incident light 322 (522), etc.) to the one or more conformal solar cell(s). In yet another aspect, the selective transmission layer can be further adapted or configured to reflect a portion of communications signals (e.g., one or more of incident Radio Frequency (RF) signals, incident microwave signals, or incident millimeter-wave signals) to create reflected communications signals.

In further non-limiting implementations, selective transmission layers (e.g., coatings or overlays 802, etc.) of solar energy collection antennas can include a metal grid (e.g., a grid of a metal, a metal wire, or a metallic composition, etc.), as further described above regarding FIGS. 7-8. In yet other non-limiting implementations, given the predetermined wavelengths of the incident solar radiation and the reflected communications signals, the grid can be further configured or adapted with a grid spacing (e.g., grid spacing d 804) to maximize the reflected communications signals, maximize transmission of the incident solar radiation (e.g., incident light 322 (522), etc.), or effect any other desired design tradeoff between these and/or other considerations.

According to yet other exemplary implementations, solar energy collection antennas can further include a communications antenna (e.g., antenna 706, such as a horn antenna) positioned or located proximate to the reflector structure (e.g., reflector 702) and adapted or configured to collect a portion of the reflected communications signals. For instance, as further described above regarding FIGS. 7-8, communications antenna can include a horn antenna located proximate to the reflector structure (e.g., reflector 702) and adapted or configured to collect a portion of the reflected communications signals.

In an aspect, a portion of the communications antenna (e.g., antenna 706, such as a horn antenna) can be located proximate to a focus associated with the substantially parabolic reflector structure. For instance, while the focusing properties of a parabolic curve on an incident parallel beam can be well suited, for example, for maximizing reflected communications signals at communications antenna (e.g., antenna 706, such as a horn antenna), other considerations can militate against using such one-sided considerations. As an example, in yet other non-limiting implementations, given the power requirements, physical spacing considerations, reflector geometry, solar energy duty cycle, and so on, the location or placement of the communications antenna (or portions thereof) can be varied in order to maximize the reflected communications signals, to maximize collection and transmission of the incident solar radiation (e.g., incident light 322 (522), etc.), to or affect any other desired design tradeoff between these and/or other considerations.

Exemplary Solar Energy Collection Antenna Systems

Figure 17:
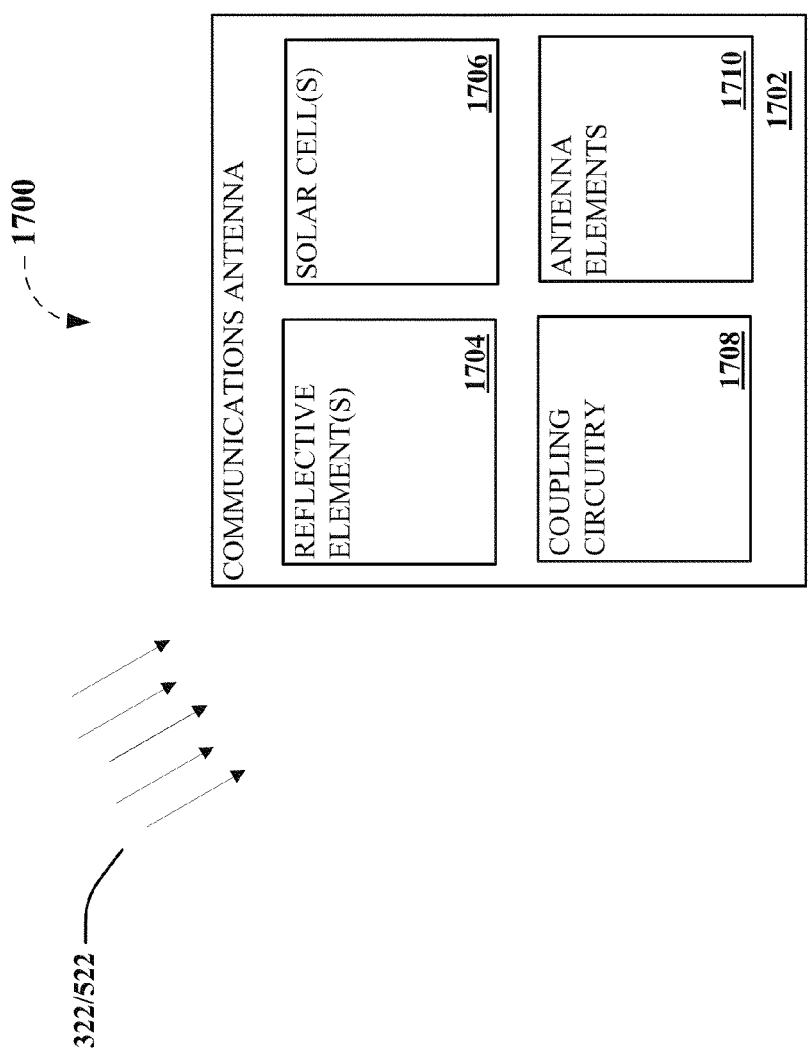
FIGS. 17-18 illustrate exemplary non-limiting functional block diagrams of embodiments of GA systems, suitable for employing implementations of the disclosed subject matter.

As described above with reference to FIGS. 1-16, various embodiments of the disclosed subject matter provide systems that can facilitate solar energy collection and use in communications systems. As an example, FIG. 17 illustrates an exemplary non-limiting functional block diagram of embodiments of a GA system, suitable for employing implementations of the disclosed subject matter. For instance, an exemplary solar energy collection system 1700 can be adapted to power an associated communications antenna. For example, solar energy collection system 1700 can comprise a communications antenna 1702 (e.g. GA 300, GA 500, etc.) configured to reflect a portion of incident solar radiation (e.g., incident light 322 (522), etc.) thereby resulting in reflected solar radiation, as described above regarding FIGS. 3-6. For instance, communications antenna 1702 configured can be configured to include reflective elements 1704 (e.g., ground plane 108, a non-planar reflective ground plane such as V-shaped concave ground plane 304, U-shaped concave ground plane 504, and the like, reflective antenna elements such as one or more SPAs 102, etc.).

In addition, solar energy collection system 1700 can further comprise one or more solar cell(s) 1706 (e.g., one or more solar cell(s) 302, one or more solar cell(s) 502, etc.). In an aspect, the one or more solar cell(s) can be positioned proximate to the reflective ground plane as described above regarding determination of H and θ with respect to FIGS. 3-6, thus facilitating receipt of reflected solar radiation and conversion of a portion of the reflected solar radiation to an electrical potential. In a further aspect, the one or more solar cell(s) 1706 can be located proximate to and associated with the communications antenna 1702.

Solar energy collection system 1700 can further comprise circuitry 1708 that can be configured or adapted to electrically couple the one or more solar cell(s) 1706 to the communications antenna 1702 and/or for operation of the communications antenna 1702 (or components or subcomponents thereof). For example, circuitry 1708 can include coupling circuitry to collect, condition, transport, or otherwise deliver suitable power to electrical components of solar energy collection system 1700, including, but not limited to communications antenna 1702. As a further example, circuitry 1708 can include any of (and any number or combination of) electrical transmission lines, electrical storage components, voltage regulators, signal conditioners, Wilkinson power dividers 1400, switches, relays, and other electrical components suitable for converting, storing, and transporting the electrical potential created by the one or more solar cell(s) 1706. Accordingly, circuitry 1708 of solar energy collection system 1700 can facilitate employing at least a portion of the electrical potential in the operation of the communications antenna 1702.

According to still further exemplary embodiments, solar energy collection system 1700 can further include one or more one antenna element(s) 1710 (e.g., SPA 102, associated L-probe 104, associated connector 106, subcomponents and/or combinations thereof, etc.) operable to transmit and/or receive communications signals (not shown), such as for example, one or more reflective SPA 102 elements as described above regarding FIGS. 3-5. As an example, further implementations can employ six antenna element(s) (e.g., reflective SPA 102 elements) in a three by two array arranged on V-shaped reflective ground plane 304 as further described above regarding FIGS. 3-4. In yet another non-limiting example, implementations can employ nine antenna element(s) (e.g., reflective suspended plate antenna (SPA) 102 elements) in a three by three array arranged on U-shaped reflective ground plane 504 as further described above regarding FIGS. 5-6.

Figure 18:
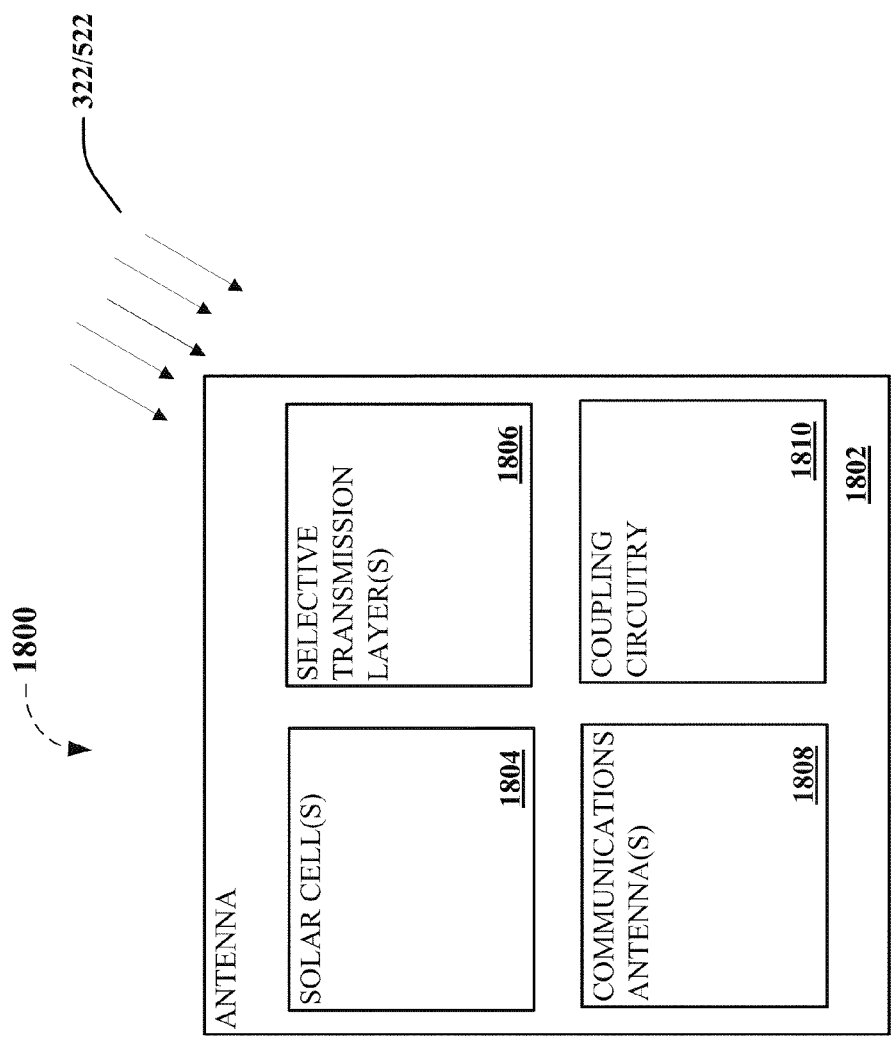

As another example, FIG. 18 illustrates an exemplary non-limiting functional block diagram of embodiments of a GA system, suitable for employing implementations of the disclosed subject matter. In further non-limiting implementations, exemplary solar energy collection system 1800 can be adapted to power an associated communications antenna, for example, as described above regarding FIGS. 7-8. For example, solar energy collection system 1800 can comprise an antenna 1802 (e.g. GA 700, etc.) according to various aspects of the disclosed subject matter.

For instance, solar energy collection system 1800 can comprise one or more solar cell(s) 1804 (e.g., one or more conformal overlaid solar cell(s) 704, etc.) that can be fabricated on, positioned on, or otherwise located adjacent to and conforming with a non-planar reflector structure (e.g., reflector 702 of GA 700, etc.). While, for purposes of illustration and not limitation, the reflector 702 is depicted and described as a parabolic reflector 702, it can be understood that the disclosed subject matter is not so limited. For instance, it is contemplated that virtually any reflector structure (e.g., whether configured as a non-planar reflector structure, or otherwise, a parabolic reflector structure, a substantially parabolic reflector structure, or otherwise, etc.) can function as reflector 702 to support one or more solar cell(s) 1804 adjacent to a reflector structure.

In addition, solar energy collection system 1800 can comprise one or more selective transmission layer(s) 1806 (e.g., a coating or overlay 802, etc.) fabricated on, positioned on, or otherwise located adjacent to the one or more solar cell(s) 1804. For instance, according to an aspect, solar energy collection system 1800 can comprise a selective transmission layer positioned on a side of the one or more solar cell(s) 1804 (e.g., one or more conformal overlaid solar cell(s) 704, etc.) opposite the non-planar reflector structure (e.g., reflector 702). In a further aspect, selective transmission layer 1806 (e.g., a coating or overlay 802, etc.) can be adapted or configured to transmit a portion of incident solar radiation (e.g., such incident light 322 (522), etc. with regard to FIGS. 3-6) to the one or more solar cell(s) 1804. In yet another aspect, the selective transmission layer can be further adapted or configured to reflect a portion of communications signals (e.g., one or more of incident Radio Frequency (RF) signals, incident microwave signals, or incident millimeter-wave signals) to create reflected communications signals.

In further non-limiting implementations, selective transmission layers 1806 (e.g., coatings or overlays 802, etc.) of solar energy collection system 1800 can include a metal grid (e.g., a grid of a metal, a metal wire, or a metallic composition, etc.), as further described above regarding FIGS. 7-8. In yet other non-limiting implementations, given the predetermined wavelengths of the incident solar radiation and the reflected communications signals, the grid can be further configured or adapted with a grid spacing (e.g., grid spacing d 804) to maximize the reflected communications signals, maximize transmission of the incident solar radiation (e.g., incident light 322 (522), etc. with regard to FIGS. 3-6), or affect any other desired design tradeoff between these and/or other considerations.

According to still further exemplary embodiments, solar energy collection system 1800 can further include one or more one communications antenna(s) 1808 (e.g., antenna 706, such as a horn antenna) operable to transmit and/or receive communications signals (not shown). For example, solar energy collection system 1800 can include a communications antenna 1808 configured to receive a reflected communications signal from the selective transmission layer 1806 as described above regarding FIGS. 7-8. For instance, communications antenna 1808 can include a horn antenna located proximate to the reflector structure (e.g., reflector 702) and adapted or configured to collect a portion of the reflected communications signals.

In further non-limiting aspect, a portion of the communications antenna 1808 (e.g., antenna 706, such as a horn antenna) can be located proximate to a focus associated with a substantially parabolic reflector structure. For instance, while the focusing properties of a parabolic curve on an incident parallel beam can be well suited, for example, for maximizing reflected communications signals at communications antenna (e.g., antenna 706, such as a horn antenna), other considerations can militate against using such one-sided considerations. As an example, in yet other non-limiting implementations, given the power requirements, physical spacing considerations, reflector geometry, solar energy duty cycle, and so on, the location or placement of the communications antenna (or portions thereof) can be varied in order to maximize the reflected communications signals, to maximize collection and transmission of the incident solar radiation (e.g., such incident light 322 (522), etc. with regard to FIGS. 3-6), to or effect any other desired design tradeoff between these and/or other considerations.

In addition, solar energy collection system 1800 can further comprise circuitry 1810 that can be configured or adapted to electrically couple the one or more solar cell(s) 1804 to the one or more communications antenna(s) 1808 and/or for operation of the one or more communications antenna(s) 1808 (or components or subcomponents thereof). For example, circuitry 1810 can include coupling circuitry to collect, condition, transport, or otherwise deliver suitable power to electrical components of solar energy collection system 1800, including, but not limited to the one or more communications antenna(s) 1808. As a further example, circuitry 1810 can include any of (and any number or combination of) electrical transmission lines, electrical storage components, voltage regulators, signal conditioners, Wilkinson power dividers 1400, switches, relays, and other electrical components suitable for converting, storing, and transporting the electrical potential created by the one or more solar cell(s) 1804. Accordingly, circuitry 1810 of solar energy collection system 1800 can facilitate employing at least a portion of the electrical potential generated by the one or more solar cell(s) 1804 in the operation of the one or more communications antenna(s) 1808.

Figure 19:
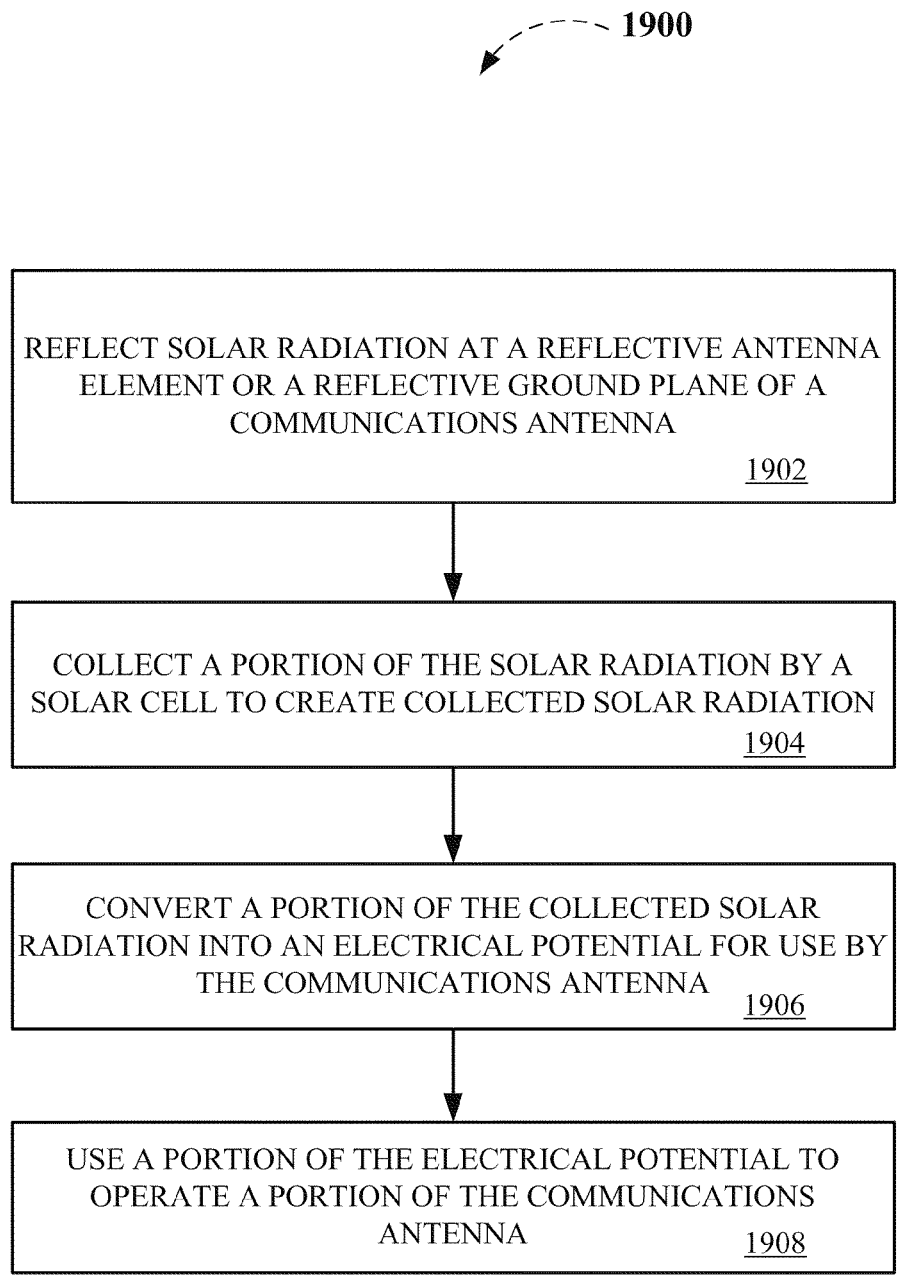
FIGS. 19-20 depict flowcharts illustrating exemplary non-limiting methodologies for solar energy collection and use in communications systems as described herein.
Figure 20:
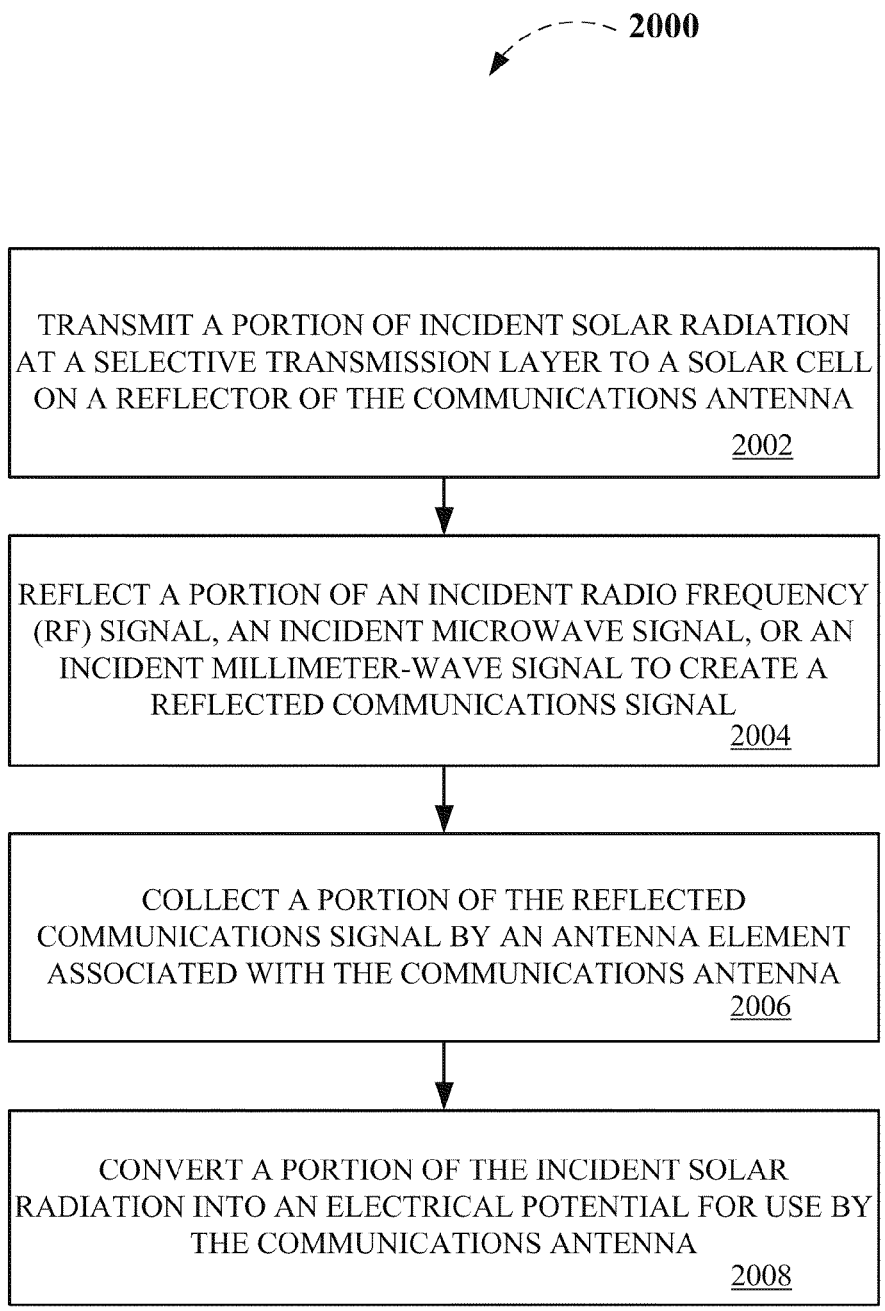

In view of the systems, components, and devices described supra, methodologies that can be implemented in accordance with the disclosed subject matter will be better appreciated with reference to the flowchart of FIGS. 19-20. While for purposes of simplicity of explanation, the methodologies are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methodologies described hereinafter.

Exemplary Methodologies

Various embodiments of the disclosed subject matter provide methodologies for solar energy collection and use in communications systems as described below with reference to FIG. 19. For instance, FIG. 19 depicts a flowchart illustrating exemplary non-limiting methodologies 1900 for solar energy collection and use in communications systems as described herein. For instance, exemplary methodologies 1900 can include collecting and employing solar energy proximate to a communications antenna (e.g. GA 300, GA 500, etc.).

For example, at 1902, methodologies 1900 can comprise reflecting solar radiation (e.g., incident light 322 (522), etc.) at a reflective antenna element or a reflective ground plane of a communications antenna (e.g., ground plane 108, a non-planar reflective ground plane such as V-shaped concave ground plane 304, U-shaped concave ground plane 504, and the like, reflective antenna elements such as one or more SPAs 102, etc.). As a further example, a first portion of incident solar radiation (e.g., incident light 322 (522), etc.) can be reflected at the communications antenna by a first portion of the communications antenna, such as, e.g., by a non-planar reflective ground plane of the communications antenna (e.g., V-shaped concave ground plane 304, U-shaped concave ground plane 504, and the like, etc.). In yet another example, methodologies 1900 can include reflecting a second portion of the incident solar radiation (e.g., incident light 322 (522), etc.) at the communications antenna by a second portion of the communications antenna, such as, e.g., by one or more antenna elements (e.g., reflective suspended plate antenna (SPA) 102 element) of the communications antenna (e.g. GA 300, GA 500, etc.).

At 1904, a portion of the solar radiation can be collected by one or more solar cell(s) (e.g., one or more solar cell(s) 302, one or more solar cell(s) 502, etc.) to create collected solar radiation. As an example, methodologies 1900 can further include collecting a portion of the first portion (or the second portion) of incident solar radiation (e.g., incident light 322 (522), etc.) by the one or more solar cell(s) thereby creating a first collected solar radiation (or a second collected solar radiation).

Thus, at 1906, a portion of the collected solar radiation (e.g., first and or second collected solar radiation, etc.) can be converted into an electrical potential e.g., voltage) for use by the communications antenna as described above regarding, for example, FIGS. 3-6. As a further example, methodologies can include, converting a portion of the first collected solar radiation (or a second collected solar radiation) into an electrical potential available for use by the communications antenna (e.g. GA 300, GA 500, etc.).

In further non-limiting methodologies 1900, a portion of the electrical potential can be used to operate a portion of the communications antenna (e.g. GA 300, GA 500, etc.). For instance, at 1908, methodologies 1900 can include using a portion of the electrical potential to operate a portion of the communications antenna. As further described above regarding FIGS. 3-6 and 17, solar energy collection systems 1700 can comprise an array of circuitry 1708 that can be configured or adapted to electrically couple the one or more solar cell(s)

1706 to the communications antenna 1702 and/or for operation of the communications antenna 1802 (or components or subcomponents thereof).

As an example, circuitry 1708 can include any of (and any number or combination of) electrical transmission lines, electrical storage components, voltage regulators, signal conditioners, Wilkinson power dividers 1400, switches, relays, and other electrical components suitable for converting, storing, and transporting the electrical potential created by the one or more solar cell(s) 1706. Accordingly, the electrical potential created by the one or more solar cell(s) (e.g., one or more solar cell(s) 302, one or more solar cell(s) 502, etc.) in methodologies 1900 can be used to operate any suitable portion of the communications antenna and/or associated or related systems.

As a further example, FIG. 20 depicts a flowchart illustrating exemplary non-limiting methodologies 2000 for solar energy collection and use in communications systems as described herein above regarding FIGS. 7-8 and 18. For instance, at 2002 a portion of incident solar radiation at a selective transmission layer can be transmitted to a solar cell on a reflector of a communications antenna (e.g., GA 700, etc.). For example, methodologies 2000 can include transmitting a portion of incident solar radiation (e.g., such incident light 322 (522), etc. with regard to FIGS. 3-6) at a selective transmission layer (e.g., a coating or overlay 802, etc.) of the communications antenna to one or more solar cell(s) (e.g., one or more conformal overlaid solar cell(s) 704, etc.) on a reflector (e.g., reflector 702 of GA 700, etc.) of the communications antenna, such as GA 700, etc. As a further example, the transmitting at 2002 can further include transmitting the portion of the incident solar radiation to one or more solar cell(s) via the selective transmission layer (e.g., a coating or overlay 802, etc.) located adjacent to the one or more solar cell(s) on a side opposite the reflector. In a further aspect, the selective transmission layer can comprise a grid of any combination of a metal, a metal wire, or a metallic composition, etc.

In addition, at 2004, a portion of an incident RF signal, an incident microwave signal, or an incident millimeter-wave signal can be reflected to create a reflected communications signal. For example, methodologies 2000 can further include reflecting a portion (e.g., via one or more selective transmission layer(s) such as coating or overlay 802, etc.) of one or more of an incident Radio Frequency RF signal, an incident microwave signal, or an incident millimeter-wave signal thereby creating a reflected communications signal.

Thus, at 2006, a portion of the reflected communications signal can be collected, for example, by an antenna element associated with the communications antenna (e.g., GA 700, etc.) as described above regarding FIGS. 7-8 and 18. For instance, methodologies 2000 can include collecting a portion of the reflected communications signal by at least one antenna element (e.g., antenna 706, such as a horn antenna) associated with the communications antenna (e.g., GA 700, etc.). In a further aspect of methodologies 2000, collecting a portion of the reflected communications signal can include collecting a portion of the reflected communications signal by the one or more antenna element(s) located proximate to a focus of a parabolic reflector structure of the reflector, as further described above regarding FIGS. 7-8 and 18.

In yet other exemplary implementations of methodologies 2000, a portion of the incident solar radiation can be converted into an electrical potential for use by the communications antenna (e.g., GA 700, etc.) at 2008. For instance, methodologies 2000 can further include converting a portion of incident solar radiation (e.g., such incident light 322 (522), etc. with regard to FIGS. 3-6) into an electrical potential (e.g., via the one or more solar cell(s)) for use by the communications antenna (e.g., GA 700, etc.).

In further non-limiting methodologies 1900, a portion of the electrical potential can be used (not shown) to operate a portion of the communications antenna. As further described above regarding FIGS. 7-8 and 18, solar energy collection systems 1800 can comprise an array of circuitry 1810 that can be configured or adapted to electrically couple the one or more solar cell(s) 1804 (e.g., one or more conformal overlaid solar cell(s) 704, etc.) to the communications antenna 1808 and/or for operation of the one or more communications antenna(s) 1808 (or components or subcomponents thereof).

As an example, circuitry 1810 can include any of (and any number or combination of) electrical transmission lines, electrical storage components, voltage regulators, signal conditioners, Wilkinson power dividers 1400, switches, relays, and other electrical components suitable for converting, storing, and transporting the electrical potential created by the one or more solar cell(s) 1804. Accordingly, the electrical potential created by the one or more solar cell(s) in methodologies 2000 can be used to operate any suitable portion of the communications antenna (e.g., GA 700, etc.) and/or associated or related systems.

Exemplary Coupled Filtering Results

Exemplary implementations of the disclosed subject matter (e.g., GA 300, GA 500, etc.) have been explored to demonstrate particular non-limiting aspects, advantages, and/or features.

Figure 21:
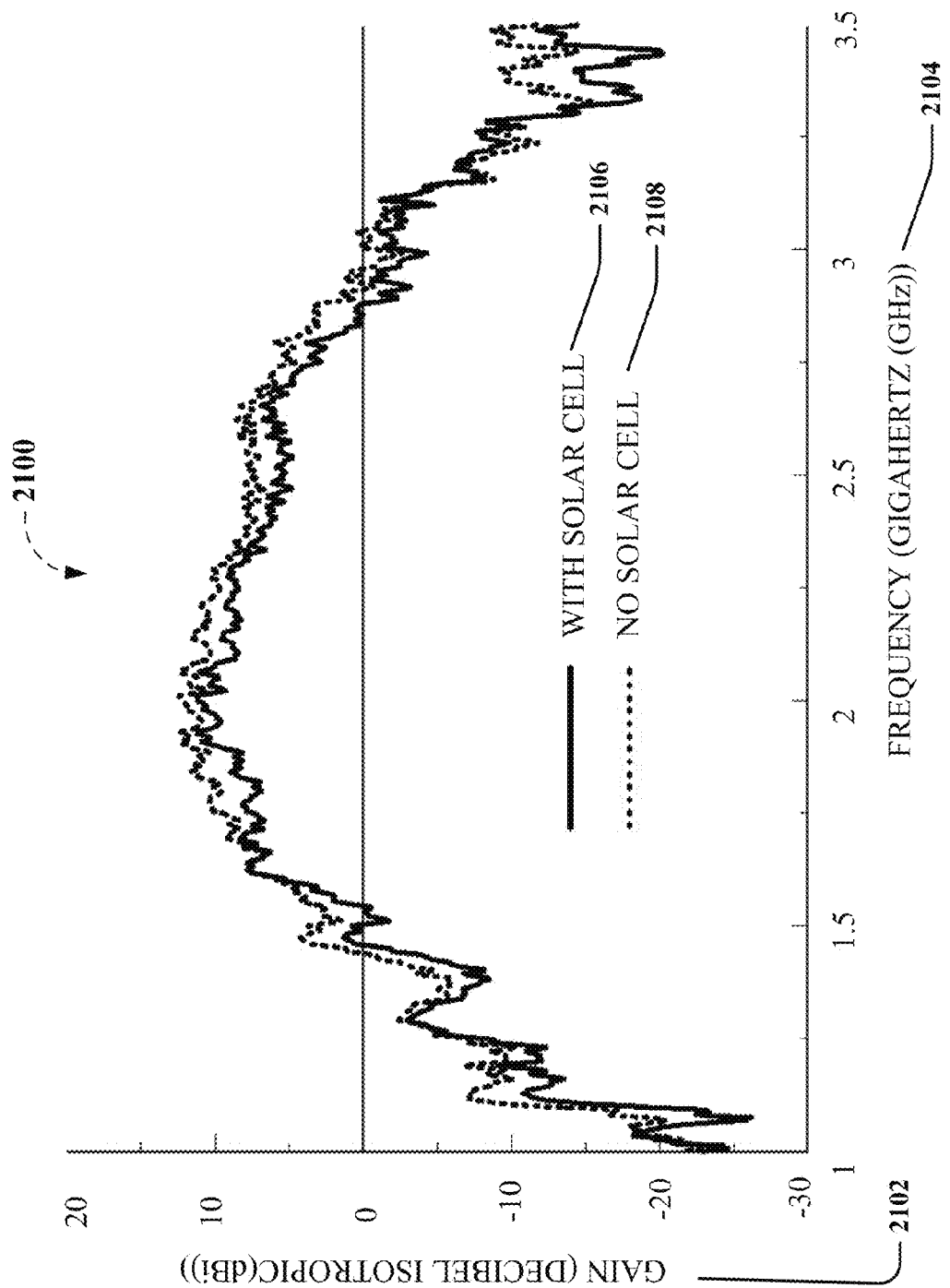
FIG. 21 depicts a measured antenna gain of an exemplary non-limiting GA with and without solar cell panels.

For example, FIG. 21 depicts a measured antenna gain 2102 of an exemplary non-limiting GA 300 with 2106 and without 2108 the one or more solar cell 302 panels. For instance, an exemplary non-limiting embodiment of GA 300 can be fabricated and tested using, for example, exemplary SPA elements 102 and a plurality of Wilkinson power dividers 1400. In addition, ground plane 304 of exemplary non-limiting embodiment of GA 300 can comprise conducting plates (e.g., 2 pieces of conducting plates each with a size of $L_g \times W_g$). As can be seen from FIG. 21, the measured antenna gain 2102 with 2106 the one or more solar cell 302 panels at 2 GHz is approximately 11.2 dBi, which is slightly lower than that without 2108 the one or more solar cell panels 302 (12.4 dBi). Thus, FIG. 21 demonstrates that for an exemplary non-limiting GA 300, loss introduced by the one or more panels 302 is relatively negligible.

Figure 22:
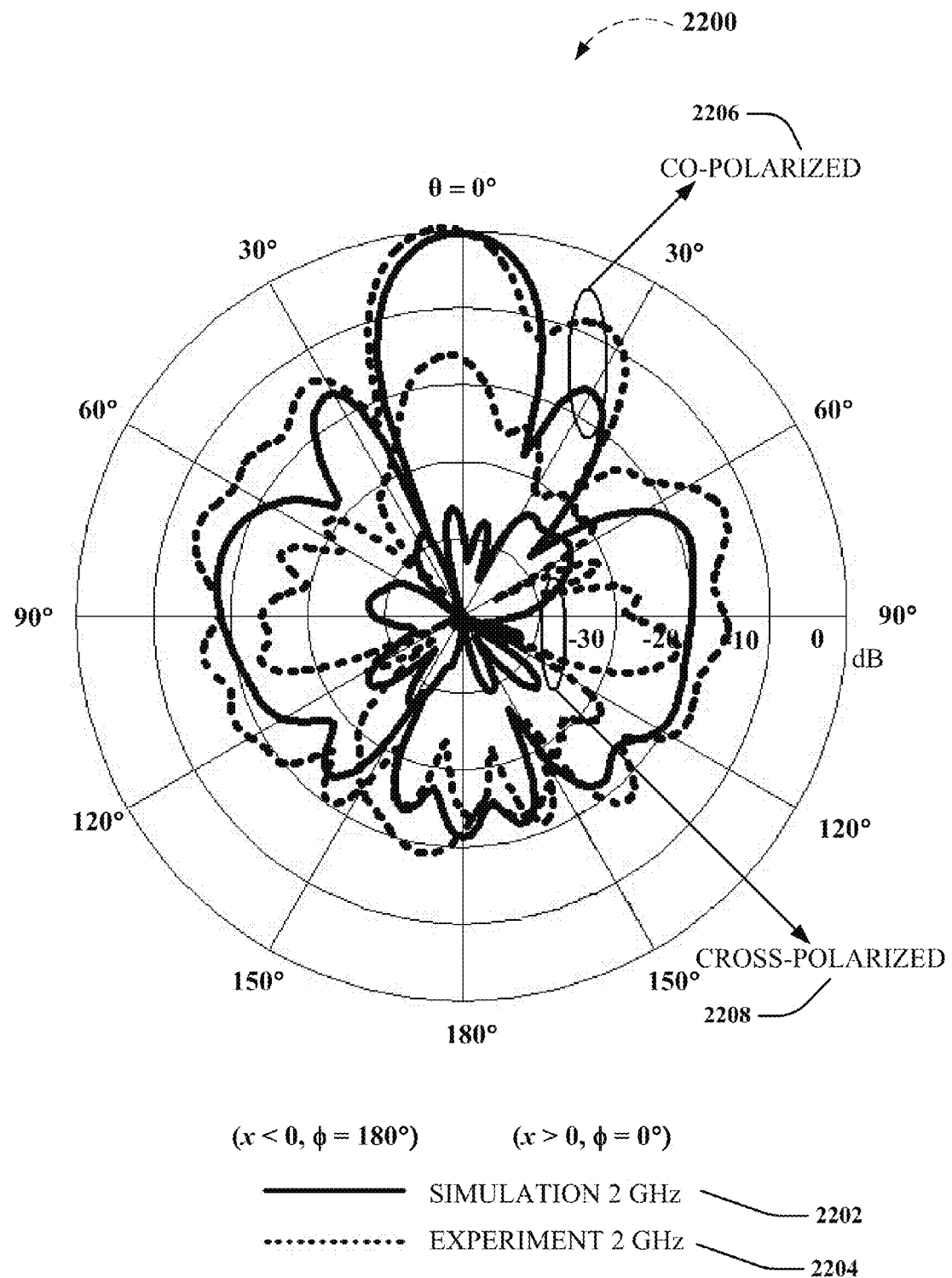
FIGS. 22-23 depict simulated and measured normalized radiation patterns of an exemplary non-limiting GA, where
Figure 23:
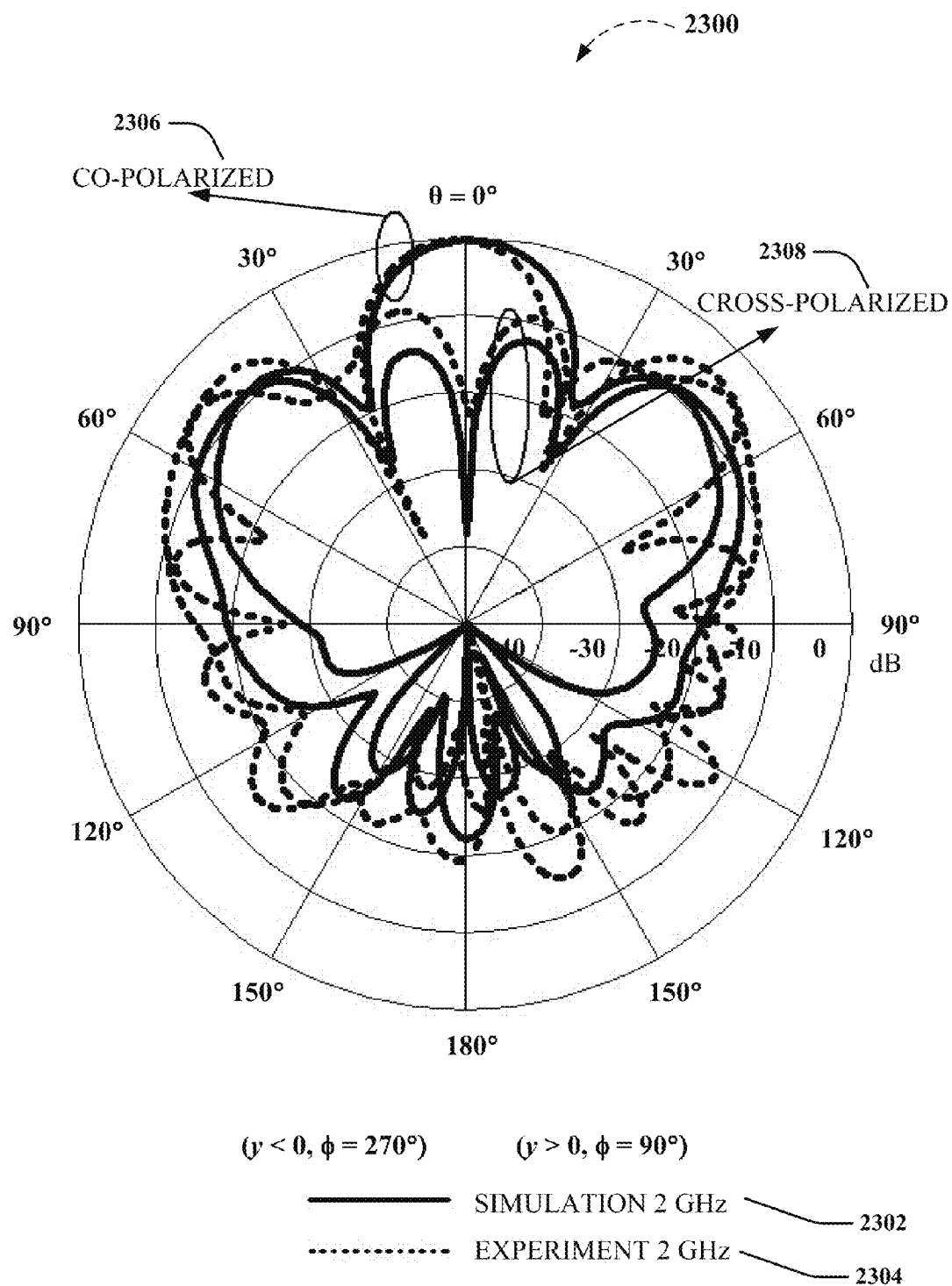

FIGS. 22-23 depict simulated and measured normalized radiation patterns of an exemplary non-limiting GA 300, where FIG. 22 depicts 2200 simulated 2202 and measured 2204 normalized radiation patterns in an E-plane, and FIG. 23 depicts 2300 simulated 2302 and measured 2304 normalized radiation patterns in an H-plane. It can be observed from FIGS. 22-23 that for both E- and H-planes, the co-polarized fields 2206 (2306) are at least 15 dB stronger than the cross-polarized fields 2208 (2308) in the boresight direction ($\theta=0°$) as could be expected for a flat ground plane case.

Figure 24:
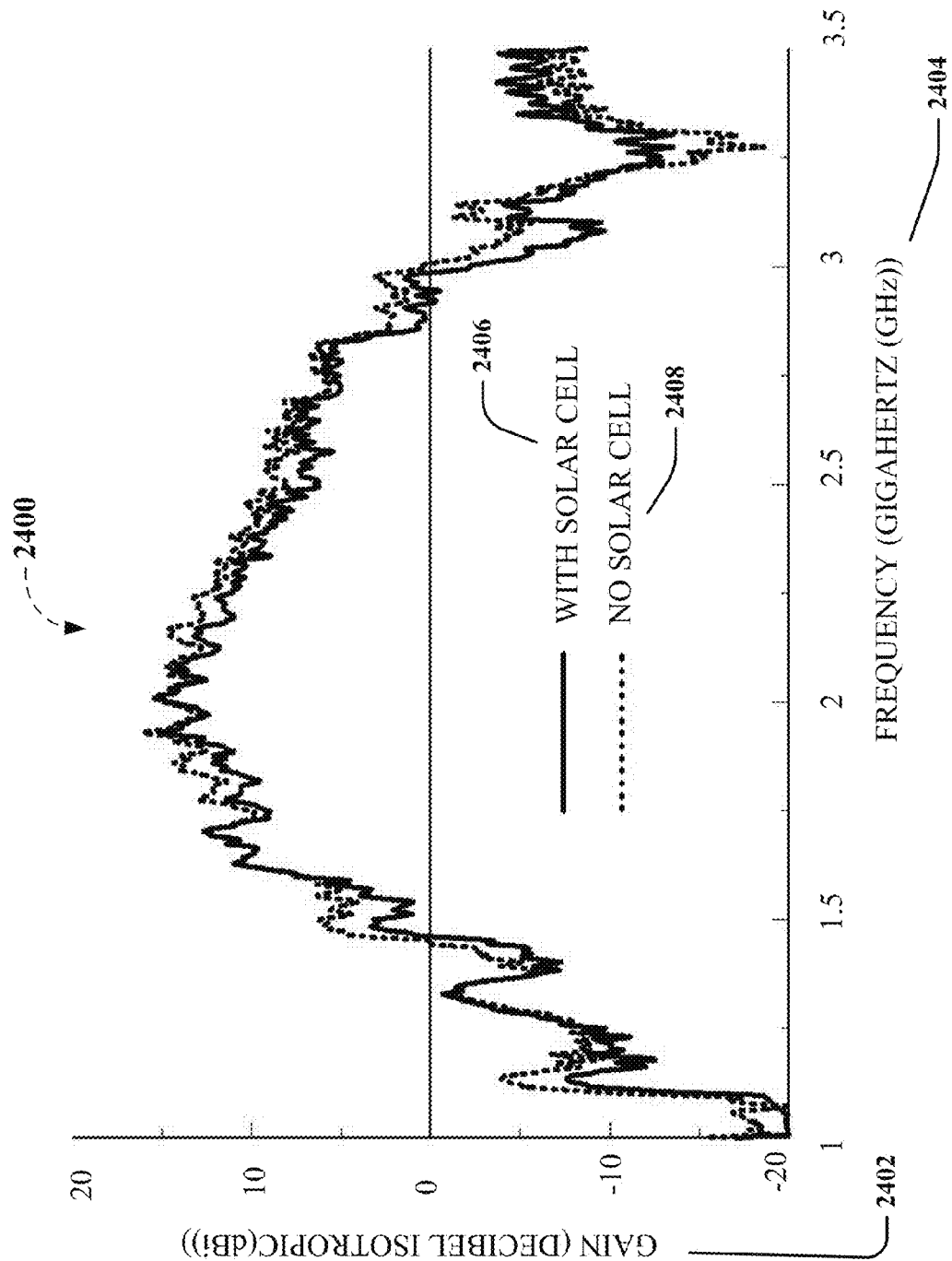
FIG. 24 depicts a measured antenna gain of a further non-limiting implementation of a GA as described herein with and without solar cell panels.

FIG. 24 depicts a measured antenna gain of a further non-limiting implementation of a GA 500 as described herein with 2406 and without 2408 the one or more solar cell 502 panels. For example, non-limiting implementation of a GA 500 can be fabricated and tested using, for example, exemplary SPA elements 102 and a plurality of Wilkinson power dividers 1400. In addition, ground plane 504 of exemplary non-limiting embodiment of GA 300 can comprise conducting plates (e.g., 3 pieces of conducting plates each with a size of $L_g \times W_g$). Thus, it can be understood that the area of ground plane 504 is larger than that of ground plane 304 of exemplary non-limiting embodiment of GA 300 by approximately 50%.

Accordingly, as can be seen from FIG. 24, the measured antenna gain 2402 with 2406 the one or more solar cell 502 panels at 2 GHz is approximately 15.2 dBi, which is slightly lower than that without 2408 the one or more solar cell panels 502 (15.5 dBi). Thus, FIG. 24 demonstrates that for a non-limiting implementation of GA 500, the loss introduced by the one or more panels 502 is relatively negligible. As a further advantage compared to exemplary non-limiting embodiment of GA 300 (gain 11.2 dBi), the gain value 15.2 dBi for non-limiting implementation of GA 500 is significantly higher due in part to a larger ground plane 504.

Figure 25:
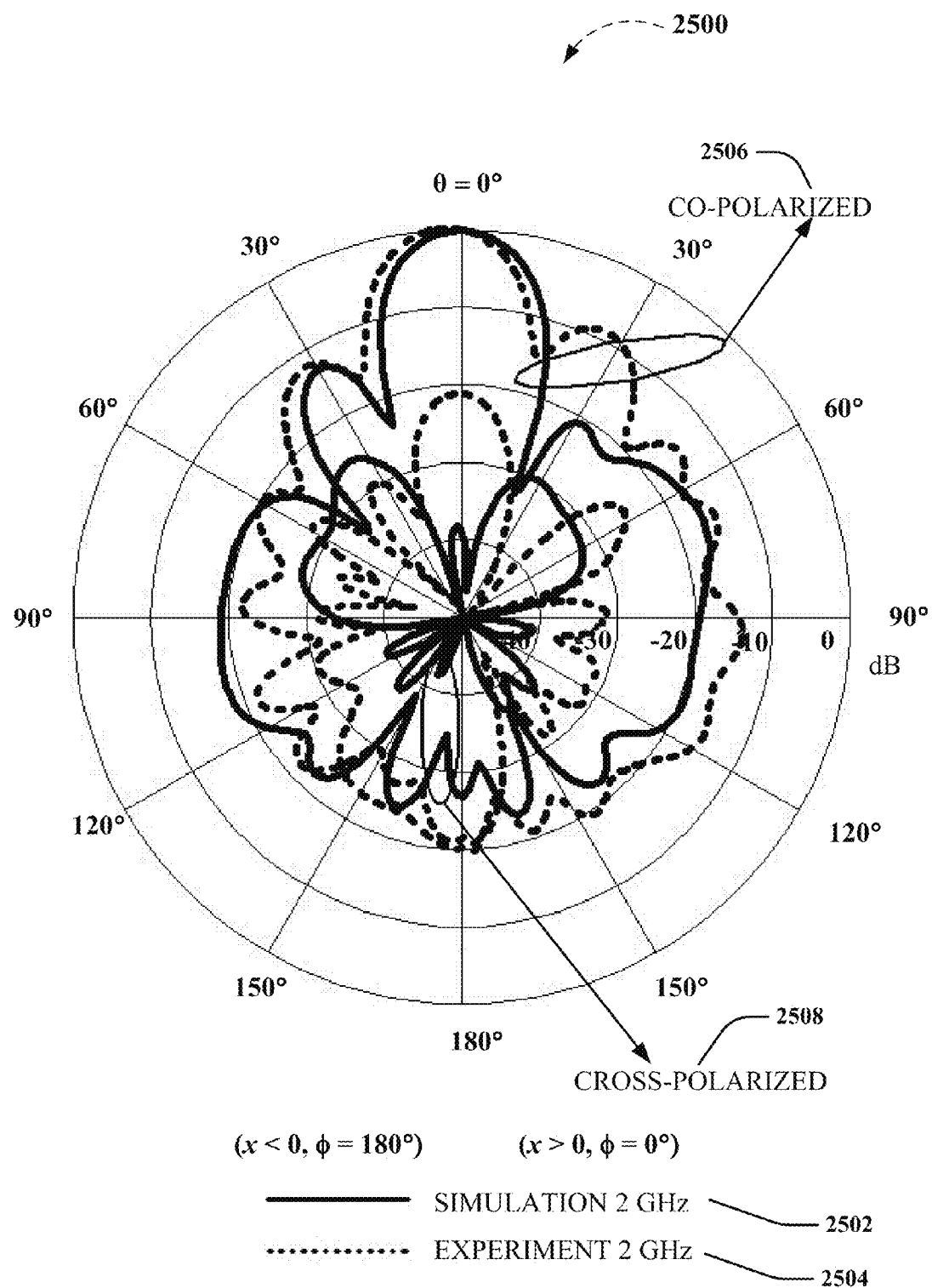
FIGS. 25-26 depict simulated and measured normalized radiation patterns of a further non-limiting implementation of a GA, where
Figure 26:
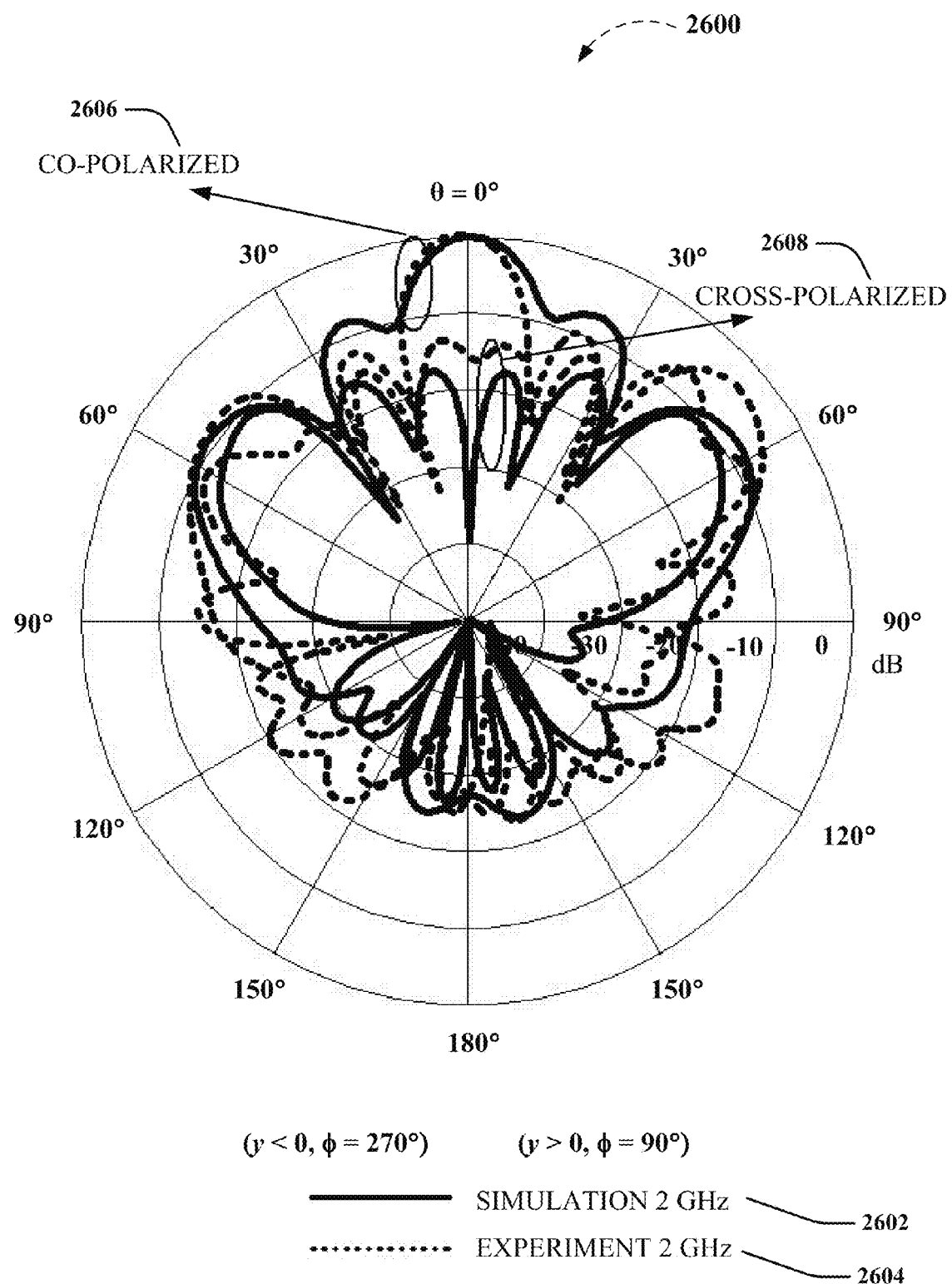

FIGS. 25-26 depict simulated and measured normalized radiation patterns of a further non-limiting implementation of a GA 500, where FIG. 25 depicts 2500 simulated 2502 and measured 2504 normalized radiation patterns in an E-plane, and FIG. 26 depicts 2600 simulated 2602 and measured 2604 normalized radiation patterns in an H-plane. It can be observed from FIGS. 25-26 that the co-polarized fields 2506 (2606) are at least 15 dB stronger than the cross-polarized fields 2508 (2608) in the boresight direction (e.g., $\theta=0°$).

Figure 27:
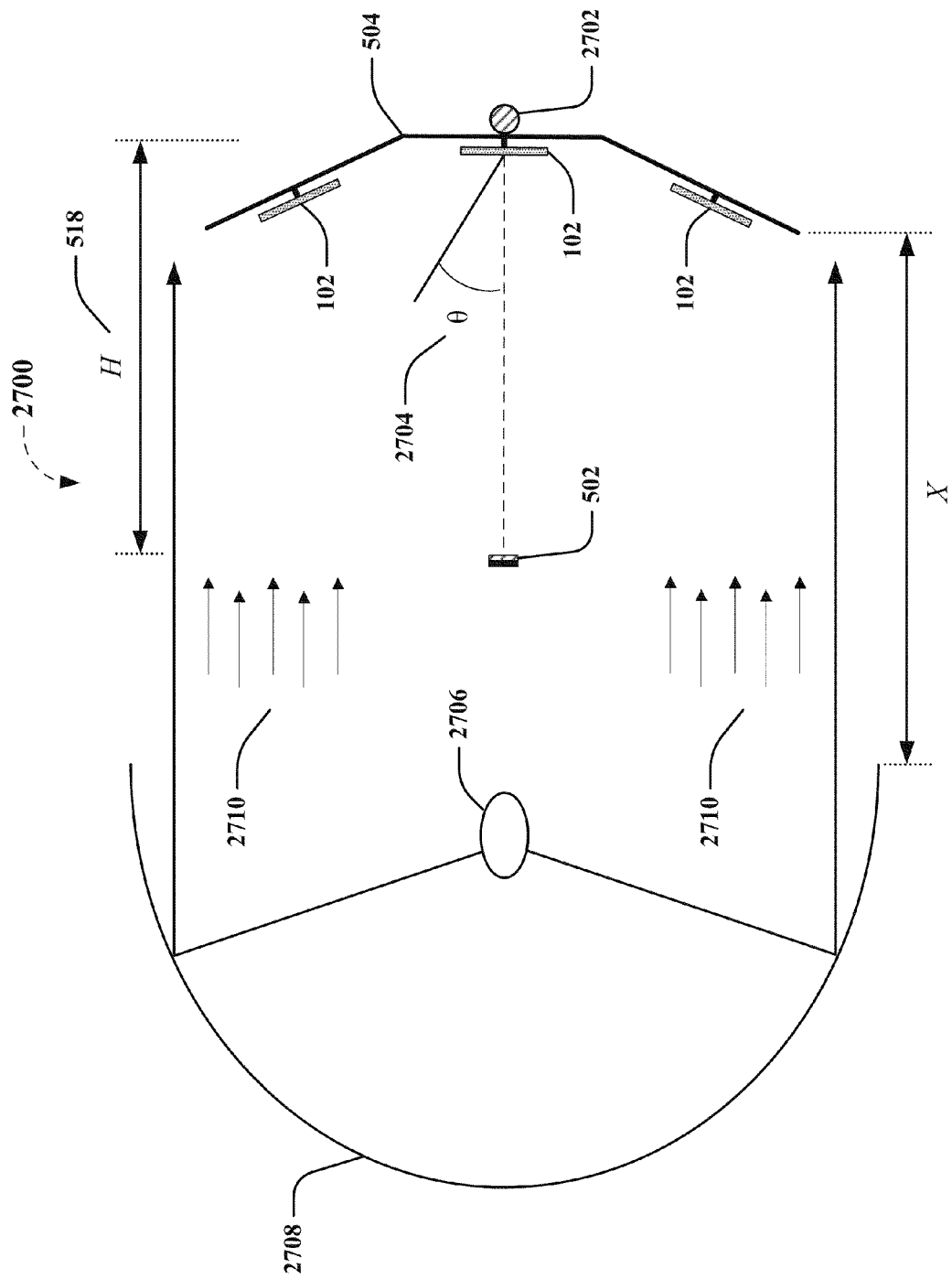
FIG. 27 illustrates a top view of an exemplary non-limiting arrangement suitable for obtaining experimental optical measurements of various embodiments of the disclosed subject matter.

FIG. 27 illustrates a top view of an exemplary non-limiting arrangement 2700 suitable for obtaining experimental optical measurements of various embodiments of the disclosed subject matter. For instance, to obtain optical performance measurements, exemplary embodiments (e.g., GA 300, GA 500, GA 700, etc.) can be placed on a rotator 2702 that facilitates measuring output voltage of the one or more solar cell panels (e.g., 302, 502, 704, etc.) at different illumination angles ($\theta$) 2704. A light source 2706 having a wide spectrum (e.g., a xenon light source) that can mimic natural daylight can be used to illuminate the exemplary embodiments. In addition, a parabolic optical dish 2708 (e.g., a parabolic optical dish with circular aperture of diameter=60 cm) can be used to used to reflect light from the light source 2706 and generate a nearly parallel light beam 2710 at a distance X (2512)=200 cm from various embodiments of the disclosed subject matter. While using an optical lens can produce a relatively more parallel light beam, it can difficult to obtain such a big lens commercially for measurement purposes. As described above, height H 518 can be found experimentally by optimizing the voltage output of the one or more solar cell panels (e.g., 302, 502, etc.) at $\theta=0°$.

Figure 28:
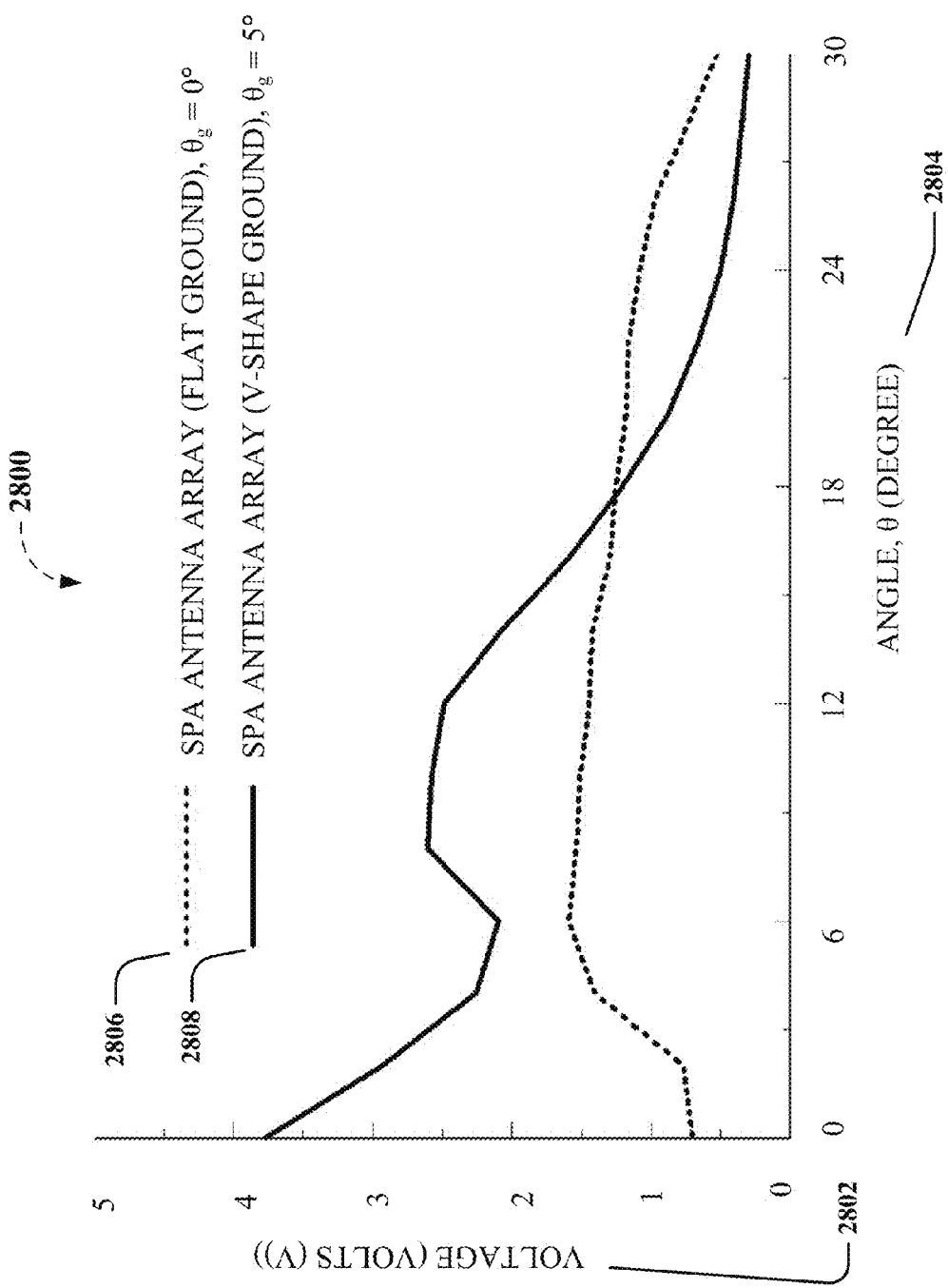
FIG. 28 depicts exemplary output voltages of solar cell panels for an exemplary non-limiting GA as a function of illumination angle (θ)

FIG. 28 depicts exemplary output voltages 2802 of the one or more solar cell panels 302 for an exemplary non-limiting GA 300 as a function of illumination angle ($\theta$) 2804. For instance, FIG. 28 depicts output voltages 2802 of the one or more solar cell panels 302 for $\theta_g=0°$ in a flat ground plane configuration 2806 and the one or more solar cell panels 302 for $\theta_g=5°$ in a V-shaped concave ground plane configuration 2808, with H=41 cm, as described above. It can be observed from FIG. 28 that when $\theta<18°$, a larger output voltage is obtained using the V-shaped ground plane 2808 due, in part, to its focusing effect. When the light 2710 is incident normally ($\theta=0°$), the output voltages are 3.77 Volts (V) and 0.70 V for the V-shaped 2808 and flat ground plane 2806 cases, respectively. For comparison (not shown), it is noted that that an output voltage of 2.61 V can be generated when the one or more solar cell panels 302 are illuminated by the light source 2706 directly (e.g. without parabolic optical dish 2708) at an equivalent total path length as when using the parabolic optical dish 2708.

Figure 29:
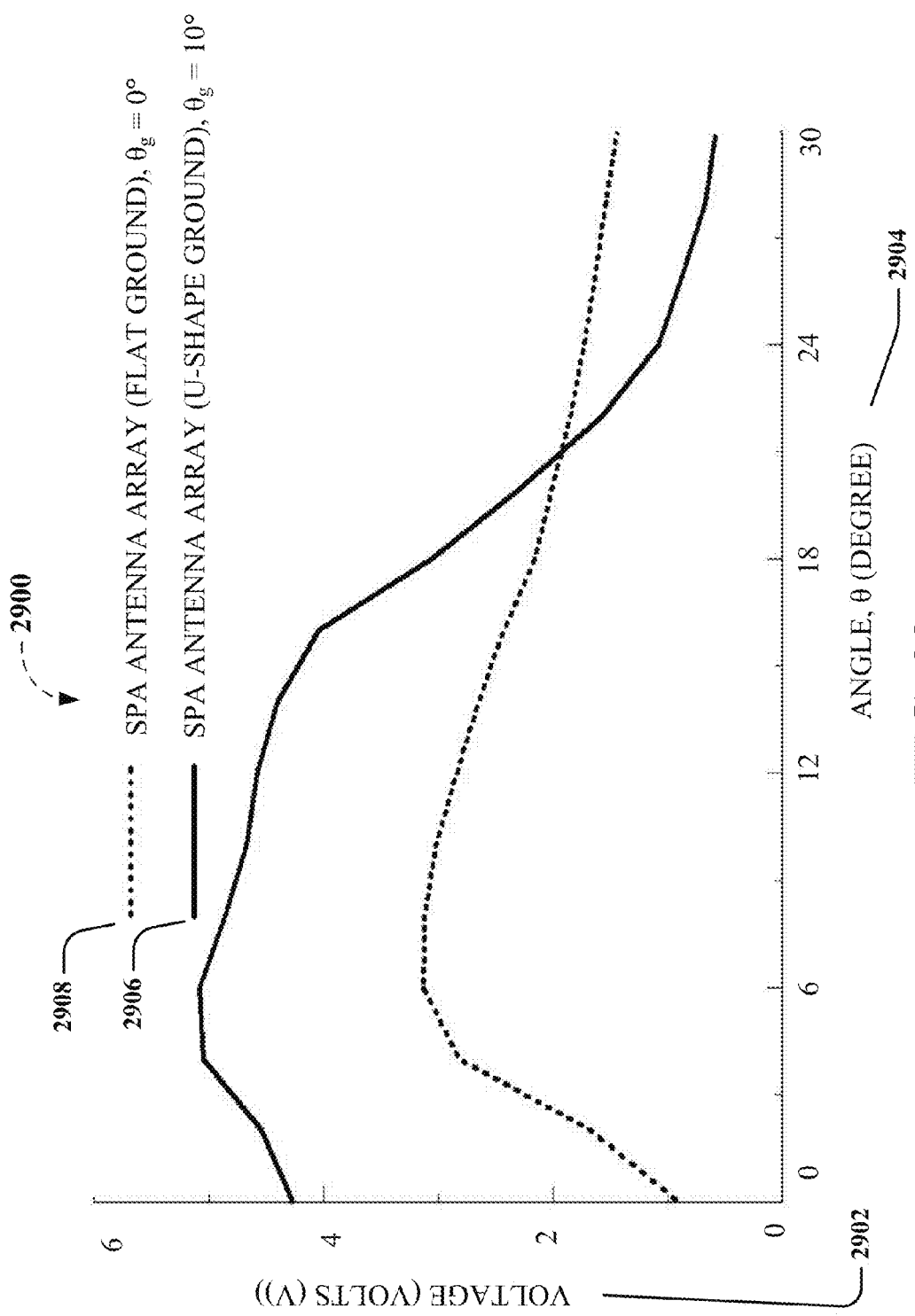
FIG. 29 depicts exemplary output voltages of solar cell panels of a further non-limiting implementation of a GA as described herein as a function of θ.

FIG. 29 depicts exemplary output voltages 2902 of the one or more solar cell panels 502 for a further non-limiting implementation of a GA 500 as described herein as a function of $\theta$ 2904. As an example, as described above regarding FIGS. 5-6, a new height of H=47 cm to obtain output voltages 2902 of the one or more solar cell panels 502 using the U-shaped ($\theta_g=10°$) 2908 and flat ($\theta_g=0°$) ground 2906 planes. It can be observed from FIG. 29 that the output voltage 2902 of the solar energy collection antenna 500 is higher when a U-shaped ground plane 504 is used, as expected.

For instance, an output voltage 2902 of 4.27 V was obtained when the light 2710 is incident normally ($\theta=0°$). In addition, it is noted that the U-shaped ground plane voltage 2908 is approximately 80% higher than that for the direct-illumination case (e.g., 2.38 V with the same total path length). Moreover, the U-shaped ground plane voltage 2908 is also higher than that exemplary non-limiting GA 300 due in part a larger reflecting surface between ground plane 504 and ground plan 304. Note further that the maximum output voltage 2902 of non-limiting implementation of GA 500 is found at $\theta=6°$, instead of $\theta=0°$, due in part to the net effect of diffractions, reflections, and light blockage due to the one or more solar cell panels 502.

Thus, in various non-limiting embodiments of the disclosed subject matter, systems, devices, and methodologies that facilitate solar energy collection and use in communications systems are provided. For instance, according to various embodiments of the disclosed subject matter, one or more solar cell(s) can be combined with an antenna structure, components, or subcomponents used for radiating functions, which can also act as a light reflector for the one or more solar cell(s). According to an aspect, implementations of the disclosed subject matter provide self-sustaining power to wireless systems employing such implementations. As a further advantage, the dual function characteristic (e.g., radiating for wireless communication and solar energy focusing or collecting) can result in cost reductions in the design, fabrication, and/or operation of systems employing such implementations. In addition, as described above, the various exemplary implementations can be applied to other areas of wireless communications, optical applications, without departing from the subject matter described herein.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components coupled to other components rather than included within parent components (hierarchical).

Additionally, it should be noted that one or more components may be combined into a single component providing aggregate functionality or divided into several separate sub-components in order to provide integrated functionality. Any components described herein may also interact with one or more other components not specifically described herein but generally known by those of skill in the art. In addition to the various embodiments described herein, it is to be understood that other similar embodiments can be used or modifications and additions can be made to the described embodiment(s) for performing the same or equivalent function of the corresponding embodiment(s) without deviating therefrom.

For example, while various embodiments of the disclosed subject matter have been described in the context of particular numbers, dimensions, configurations, geometry, or arrangements (e.g., numbers, dimensions, configurations, geometry, or arrangements of SPAs, ground planes, solar cells, etc.), the disclosed subject matter is not so limited. In addition, it is contemplated that applications of various aspects of the disclosed subject matter can be altered, modified, or otherwise redesigned, for instance, by choosing variations in wavelengths for communications (e.g., transmission and reception of communications signals). In other exemplary modifications, variations in coatings or overlays can be chosen, for example, in a desire to maximize reflection of incident radiation of interest (e.g., wireless communications carrier signal), transmission of solar radiation to maximize solar generation capability, both, or an intermediate desired result.

What is claimed is:

1. A solar energy collection antenna, comprising:
    a reflective ground plane adapted to reflect at least a first portion of incident solar radiation resulting in reflected solar radiation;
    at least one antenna element comprising at least one suspended plate antenna (SPA) element, wherein the at least one antenna element is coupled to the reflective ground plane, and wherein the at least one SPA element is adapted to reflect at least a second portion of the incident solar radiation to increase the reflected solar radiation; and
    at least one solar cell positioned proximate to the reflective ground plane and adapted to receive at least a portion of the reflected solar radiation.

2. The solar energy collection antenna of claim 1, wherein the at least one SPA element is adapted to receive excitation via an L-probe proximate to the ground plane.

3. The solar energy collection antenna of claim 1, wherein the reflective ground plane is further configured as a non-planar reflective ground plane.

4. The solar energy collection antenna of claim 3, wherein the non-planar reflective ground plane is further configured as V-shaped reflective ground plane.

5. The solar energy collection antenna of claim 4, wherein the at least one antenna element comprises six reflective SPA elements in a three by two array of reflective SPA elements coupled to the V-shaped reflective ground plane.

6. The solar energy collection antenna of claim 3, wherein the non-planar reflective ground plane is further configured as U-shaped reflective ground plane.

7. The solar energy collection antenna of claim 6, wherein the at least one antenna element comprises nine reflective SPA elements in a three by three array of reflective SPA elements U-shaped reflective ground plane.

8. A solar energy collection system adapted to power an associated communications antenna, comprising:
    a communications antenna comprising at least one reflective ground plane and at least one reflective suspended plate antenna (SPA) element, wherein the at least one reflective SPA element is configured to reflect at least a portion of incident solar radiation resulting in reflected solar radiation;
    at least one solar cell proximate to and associated with the communications antenna that converts at least a portion of the reflected solar radiation to an electrical potential; and
    circuitry adapted to electrically couple the at least one solar cell to the communications antenna to employ at least a portion of the electrical potential in the operation of the communications antenna.

9. The solar energy collection system of claim 8, wherein the reflective ground plane is further configured as a non-planar reflective ground plane.

10. The solar energy collection system of claim 9, wherein the non-planar reflective ground plane comprises a V-shaped reflective ground plane, and wherein the communications antenna comprising six reflective SPA elements in a three by two array of reflective SPA elements supported on the V-shaped reflective ground plane.

11. The solar energy collection system of claim 9, wherein the non-planar reflective ground plane comprises a U-shaped reflective ground plane, and wherein the communications antenna comprising nine reflective SPA elements in a three by three array of reflective SPA elements supported on the U-shaped reflective ground plane.

12. A method for collecting and employing solar energy proximate to a communications antenna:
    reflecting at least a first portion of incident solar radiation at the communications antenna by a first portion of the communications antenna;
    reflecting at least a second portion of the incident solar radiation at the communications antenna by at least one reflective suspended plate antenna (SPA) element of the communications antenna;
    collecting at least a portion of the first portion of incident solar radiation by at least one solar cell proximate to the communications antenna to create a first collected solar radiation; and
    converting at least a portion of the first collected solar radiation into an electrical potential for use by the communications antenna.

13. The method of claim 12, further comprising:
    using at least a portion of the electrical potential to operate at least a portion of the communications antenna.

14. The method of claim 12, wherein the reflecting at least the first portion of the incident solar radiation comprises reflecting at least the first portion of the incident solar radiation by a non-planar reflective ground plane of the communications antenna.

15. The method of claim 12, wherein the reflecting at least the first portion of the incident solar radiation by a non-planar reflective ground plane comprises reflecting at least the first portion of the incident solar radiation by at least one of a V-shaped reflective ground plane or a U-shaped reflective ground plane.

* * * * *